(12) United States Patent
Shi et al.

(10) Patent No.: US 12,159,676 B2
(45) Date of Patent: Dec. 3, 2024

(54) MEMORY DEVICE AND READ OPERATION DURING SUSPENSION OF PROGRAM OPERATION THEREOF

(71) Applicant: YANGTZE MEMORY TECHNOLOGIES CO., LTD., Wuhan (CN)

(72) Inventors: Lei Shi, Wuhan (CN); Zhuqin Duan, Wuhan (CN); Jialiang Deng, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 76 days.

(21) Appl. No.: 17/891,072

(22) Filed: Aug. 18, 2022

(65) Prior Publication Data
US 2024/0062831 A1 Feb. 22, 2024

(51) Int. Cl.
*G11C 16/26* (2006.01)
*G11C 11/56* (2006.01)
*G11C 16/04* (2006.01)
*G11C 16/10* (2006.01)
*G11C 16/24* (2006.01)

(52) U.S. Cl.
CPC .......... *G11C 16/26* (2013.01); *G11C 11/5628* (2013.01); *G11C 11/5642* (2013.01); *G11C 11/5671* (2013.01); *G11C 16/0483* (2013.01); *G11C 16/10* (2013.01); *G11C 16/24* (2013.01); *G11C 2216/20* (2013.01)

(58) Field of Classification Search
CPC ..... G11C 16/26; G11C 16/0483; G11C 16/10; G11C 16/24; G11C 2216/20; G11C 11/5628; G11C 11/5642; G11C 11/5671
See application file for complete search history.

(56) References Cited

U.S. PATENT DOCUMENTS

| | | | | |
|---|---|---|---|---|
| 9,601,169 B2 * | 3/2017 | Hong | ...................... | G11C 7/22 |
| 10,249,377 B2 * | 4/2019 | Kasai | .................. | G11C 11/5628 |
| 10,734,078 B2 | 8/2020 | Lee | | |
| 11,164,640 B2 * | 11/2021 | Kim | ...................... | G11C 16/30 |
| 11,164,643 B2 * | 11/2021 | Kim | ................... | G11C 16/0483 |

(Continued)

FOREIGN PATENT DOCUMENTS

| TW | 201812750 A | 4/2018 |
|---|---|---|
| WO | 2011067795 A1 | 6/2011 |

*Primary Examiner* — Son L Mai
(74) *Attorney, Agent, or Firm* — BAYES PLLC

(57) ABSTRACT

In certain aspects, a memory device includes an array of memory cells and a peripheral circuit. The array of memory cells includes a first memory cell and a second memory cell. The peripheral circuit includes a page buffer circuit and control logic. The page buffer circuit is coupled to the first and second memory cells, respectively, and includes a sense out (SO) node and a cache storage unit. The control logic is coupled to the page buffer and configured to suspend a program operation on the first memory cell responsive to receiving a suspension command indicative of executing a read operation on the second memory cell. The control logic is further configured to control the page buffer circuit to store suspended program information associated with a suspension of the program operation, and initiate the read operation on the second memory cell through the SO node and the cache storage unit.

20 Claims, 15 Drawing Sheets

(56) References Cited

U.S. PATENT DOCUMENTS

| | | | |
|---|---|---|---|
| 11,307,803 B2* | 4/2022 | Shin | G06F 3/061 |
| 11,366,760 B2* | 6/2022 | Alhussien | G06F 9/30098 |
| 11,574,683 B2* | 2/2023 | Lee | G11C 16/0483 |
| 11,698,864 B2* | 7/2023 | Alhussien | G06F 9/30098 |
| | | | 711/154 |
| 11,901,012 B2* | 2/2024 | Kim | H01L 24/08 |
| 2016/0313946 A1* | 10/2016 | Zang | G06F 3/0611 |
| 2023/0230640 A1* | 7/2023 | Cho | G11C 11/5642 |
| | | | 365/185.12 |
| 2024/0062821 A1* | 2/2024 | Deng | G11C 16/26 |
| 2024/0062830 A1* | 2/2024 | Deng | G11C 16/24 |

* cited by examiner

301

| TABLE 1 | 0 | 1 | 2 | 3 | 4 | 5 | 6 | 7 |
|---|---|---|---|---|---|---|---|---|
| LV | 0 | 0 | 0 | 0 | 0 | 0 | 0 | 0 |
| b1 | 0 | 0 | 1 | 1 | 1 | 1 | 1 | 1 |
| b2 | 0 | 0 | 1 | 1 | 1 | 1 | 0 | 0 |
| b3 | 0 | 1 | 1 | 0 | 0 | 1 | 1 | 0 |
FIG. 5B

TABLE 2

| TLC 5 Latch | Sensing Storage Unit (DS) | Bit Line Storage Unit (DL) | Data Storage Unit ($D_1$) | Data Storage Unit ($D_2$) | Cache Storage Unit |
|---|---|---|---|---|---|
| Stored Info/Data | INH | UP DATA | LP DATA | MP DATA | |

TABLE 3

| QLC 6 Latch | Sensing Storage Unit (DS) | Bit Line Storage Unit (DL) | Data Storage Unit ($D_1$) | Data Storage Unit ($D_2$) | Data Storage Unit ($D_3$) | Cache Storage Unit |
|---|---|---|---|---|---|---|
| Stored Info/Data | INH | XP DATA | LP DATA | MP DATA | UP DATA | |

TABLE 4 (902)

| | 0 | 1 | 2 | 3 | 4 | 5 | 6 | 7 | 8 | 9 | 10 | 11 | 12 | 13 | 14 | 15 | Read times |
|---|---|---|---|---|---|---|---|---|---|---|---|---|---|---|---|---|---|
| LP | 1 | 1 | 0 | 0 | 0 | 0 | 0 | 0 | 1 | 1 | 1 | 1 | 1 | 1 | 0 | 0 | 3 |
| MP | 1 | 1 | 1 | 0 | 0 | 0 | 0 | 1 | 1 | 0 | 0 | 0 | 0 | 1 | 1 | 1 | 4 |
| UP | 1 | 1 | 1 | 1 | 1 | 0 | 0 | 0 | 0 | 0 | 0 | 0 | 0 | 0 | 0 | 1 | 4 |
| XP | 1 | 0 | 0 | 0 | 1 | 1 | 0 | 0 | 0 | 0 | 0 | 0 | 0 | 1 | 1 | 1 | 4 |

TABLE 5

| Operation | | E | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|---|---|
| SET C=1 | C | 1 | 1 | 1 | 1 | 1 | 1 | 1 | 1 | 1 | 1 | 1 | 1 | 1 | 1 | 1 | 1 | (904) |
| PRECH_ALL | SO | 1 | 0 | 0 | 1 | 1 | 1 | 0 | 0 | 1 | 1 | 1 | 1 | 1 | 1 | 1 | 1 | (906) |
| SENSING @L2 | SO | 0 | 0 | 1 | 1 | 1 | 1 | 1 | 1 | 1 | 1 | 1 | 1 | 1 | 1 | 1 | 1 | (908) |
| RST_C | C | 1 | 1 | 1 | 0 | 0 | 0 | 0 | 0 | 0 | 0 | 0 | 0 | 0 | 0 | 0 | 0 | (910) |
| PRECH_ALL | SO | 1 | 1 | 1 | 1 | 1 | 1 | 1 | 1 | 1 | 1 | 1 | 1 | 1 | 1 | 1 | 1 | (912) |
| SENSING @L8 | SO | 0 | 0 | 0 | 0 | 0 | 0 | 0 | 0 | 0 | 1 | 1 | 1 | 1 | 1 | 1 | 1 | (914) |
| SET_C | C | 1 | 1 | 1 | 1 | 1 | 1 | 1 | 1 | 1 | 1 | 1 | 1 | 1 | 1 | 1 | 1 | (916) |
| PRECH_ALL | SO | 1 | 1 | 1 | 1 | 1 | 1 | 1 | 1 | 1 | 1 | 1 | 1 | 1 | 1 | 1 | 1 | (918) |
| SENSING @L14 | SO | 0 | 0 | 0 | 0 | 0 | 0 | 0 | 0 | 0 | 0 | 0 | 0 | 0 | 0 | 1 | 1 | (920) |
| RST_C | C | 1 | 1 | 1 | 1 | 1 | 1 | 1 | 1 | 1 | 1 | 1 | 1 | 1 | 1 | 0 | 0 | (922) |

MEMORY DEVICE AND READ OPERATION DURING SUSPENSION OF PROGRAM OPERATION THEREOF

CROSS-REFERENCE TO RELATED APPLICATIONS

This application is related to U.S. application Ser. No. 17/891,065, filed on Aug. 18, 2022, entitled "MEMORY DEVICE AND READ OPERATION DURING SUSPENSION OF PROGRAM OPERATION THEREOF," and U.S. application Ser. No. 17/891,068, filed on Aug. 18, 2022, entitled "MEMORY DEVICE AND READ OPERATION DURING SUSPENSION OF PROGRAM OPERATION THEREOF," both of which are hereby incorporated by reference in their entireties.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, and a program operation or a read operation can be performed at the page level.

SUMMARY

In one aspect, a memory device includes an array of memory cells and a peripheral circuit coupled to the array of memory cells. The array of memory cells includes a first memory cell and a second memory cell. The peripheral circuit includes a page buffer and control logic. The page buffer includes at least a page buffer circuit that is coupled to the first and second memory cells, respectively. The page buffer circuit includes a sense out (SO) node and a cache storage unit. The control logic is coupled to the page buffer and configured to suspend a program operation on the first memory cell responsive to receiving a suspension command indicative of executing a read operation on the second memory cell. The control logic is further configured to control the page buffer circuit to store suspended program information associated with a suspension of the program operation, and initiate the read operation on the second memory cell through the SO node and the cache storage unit.

In another aspect, a system includes a memory device configured to store data and a memory controller coupled to the memory device. The memory device includes an array of memory cells and a peripheral circuit coupled to the array of memory cells. The array of memory cells includes a first memory cell and a second memory cell. The peripheral circuit includes a page buffer and control logic coupled to the page buffer. The page buffer includes at least a page buffer circuit that is coupled to the first and second memory cells, respectively. The page buffer circuit includes an SO node and a cache storage unit. The control logic is coupled to the page buffer and configured to suspend a program operation on the first memory cell responsive to receiving a suspension command indicative of executing a read operation on the second memory cell. The cache storage unit is in an idle state responsive to a suspension of the program operation. The control logic is further configured to initiate the read operation on the second memory cell through the SO node and the cache storage unit. The memory controller is configured to control the memory device.

In still another aspect, a method for operating a memory device including an array of memory cells is provided. The array of memory cells includes a first memory cell and a second memory cell that are coupled to a page buffer circuit in a page buffer. The page buffer circuit includes an SO node and a cache storage unit. A program operation on the first memory cell is suspended responsive to receiving a suspension command indicative of executing a read operation on the second memory cell. The page buffer circuit is controlled to store suspended program information associated with a suspension of the program operation. The read operation on the second memory cell is initiated through the SO node and the cache storage unit.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 5B illustrates a graphical representation illustrating exemplary three bits of binary values for a piece of 3-bits data, according to some aspects of the present disclosure.

FIG. 8 is a graphical representation illustrating exemplary suspended program information stored in a page buffer circuit during an execution of a read operation, according to some aspects of the present disclosure.

FIG. 9 is a graphical representation illustrating an exemplary process for reading a portion of page data, according to some aspects of the present disclosure.

Figure 1:
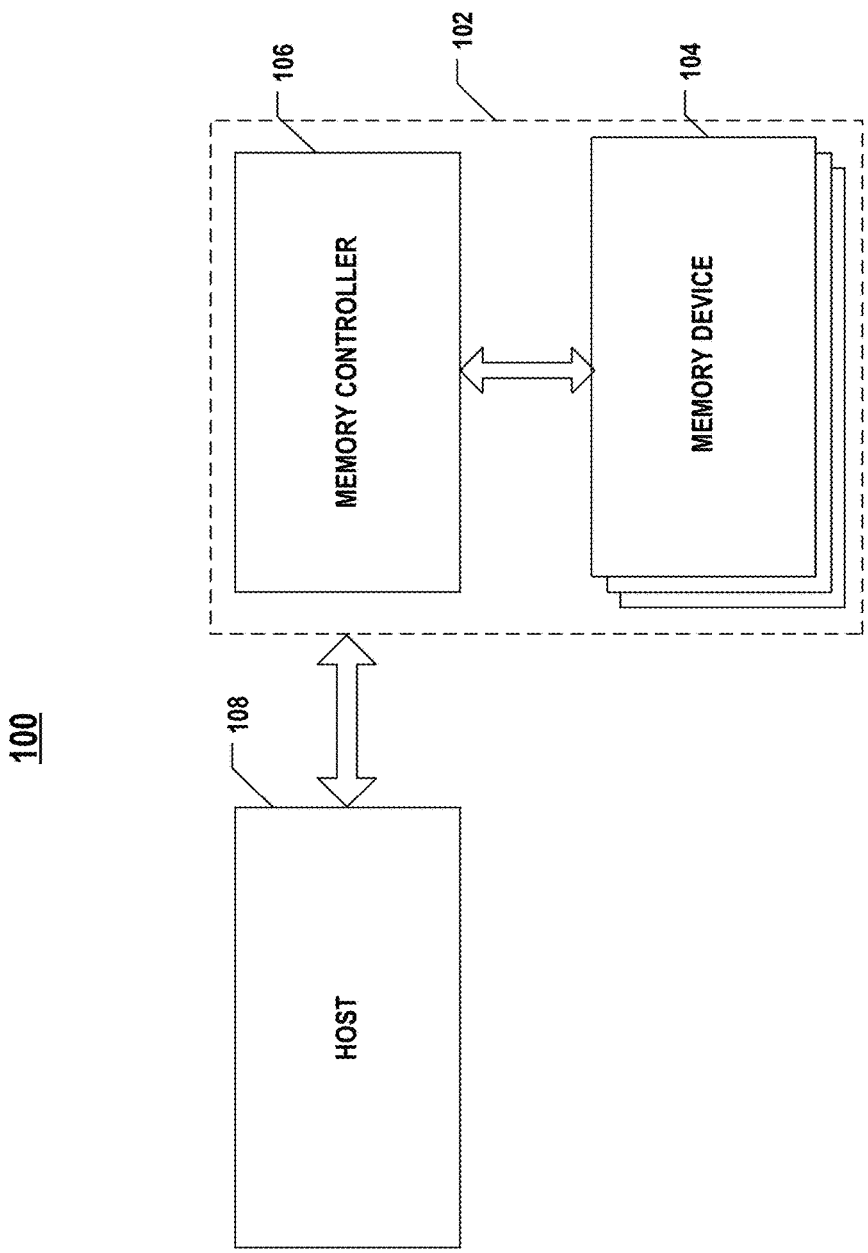
FIG. 1 illustrates a block diagram of a system having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

A NAND Flash memory device can perform program (write) operations at the page/word line level, i.e., programming all the memory cells coupled to the same select word line at the same time. Since each program operation takes a relatively long time (e.g., several hundred of microseconds (µS)) as it may involve multiple passes, each having multiple cycles of applying program pulses and verify pulses, the NAND Flash memory device usually supports interrupts during a program operation on one page to suspend the ongoing program operation and switch to another operation (e.g., a read operation on another page). Once the other operation is finished, the suspended program operation can be resumed to program the original page. In this case, a program-operation suspension feature can be supported by the NAND Flash memory device.

During the suspended period of the program operation (e.g., between the time when the program operation is suspended and the time when the program operation is resumed), the NAND Flash memory device may be implemented in a destructive mode or non-destructive mode. For example, if the NAND Flash memory device is implemented in the destructive mode, suspended program information associated with the suspension of the program operation is not stored in the NAND Flash memory device. In this case, in order to support the program-operation suspension feature in the NAND Flash memory device, all the suspended program information needs to be stored in a memory controller that controls the NAND Flash memory device. As a result, cache resources and bandwidth resources of the memory controller are consumed or occupied by the storage of the suspended program information in the memory controller. If the program operation suspension occurs frequently, the performance of the memory controller may be degraded with frequent storage of the suspended program information in the memory controller.

In another example, if the NAND Flash memory device is implemented in the non-destructive mode, all the suspended program information may be stored in the NAND Flash memory device. However, for a current triple-level cell (TLC) NAND Flash memory device (with 5 latches in each page buffer circuit that is coupled to a respective memory string through a bit line) or a current quad-level cell (QLC) NAND Flash memory device (with 6 latches in each page buffer circuit that is coupled to a respective memory string through a bit line), it is difficult to support the program-operation suspension feature in the memory device under the non-destructive mode due to the limited number of latches included in each page buffer circuit.

Specifically, if the program operation is interrupted by a read operation, and the program operation and the read operation are performed on the same memory string, then the same page buffer circuit is used to execute the program operation and the read operation. With respect to the TLC NAND Flash memory device with 5 latches in each page buffer circuit, the suspended program information may include 4 pieces of program information to be stored in 4 latches of the page buffer circuit (e.g., as shown in Table 2 of FIG. 8). In this case, only one latch is left in an idle state and can be used for the read operation during the suspension of the program operation. Since at least two latches (e.g., a sensing latch and another latch) are needed to execute the read operation under existing reading schemes, the read operation cannot be executed by the page buffer circuit due to the shortage of one latch in the page buffer circuit.

Similarly, with respect to the QLC NAND Flash memory device with 6 latches in each page buffer circuit, the suspended program information may include 5 pieces of program information to be stored in 5 latches of the page buffer circuit (e.g., as shown in Table 3 of FIG. 8). In this case, only one latch is left in an idle state and can be used for the read operation during the suspension of the program operation. Thus, the read operation that needs at least two idle latches under existing reading schemes cannot be executed by the page buffer circuit due to the shortage of one latch in the page buffer circuit.

To solve the above latch shortage issue in the memory device, one more latch may be added to each page buffer circuit of the TLC or QLC NAND Flash memory device so that the memory device can support the program-operation suspension feature under the non-destructive mode. However, the adding of one more latch in each page buffer circuit may increase the circuit area of the page buffer greatly, which may have an impact on the design and manufacture of the memory device. The cost of the memory device may be increased as well.

To address one or more of the aforementioned issues, the present disclosure introduces a solution that utilizes an SO node and a cache storage unit of a page buffer circuit from a memory device to initiate a read operation during a suspension of a program operation, where the program operation is performed on a first select memory cell of the memory device through the page buffer circuit, and the read operation is performed on a second select memory cell of the memory device through the page buffer circuit. The first and second select memory cells are in a three-dimensional (3D) NAND memory string and coupled to the page buffer circuit.

Specifically, the solution disclosed herein may suspend the program operation on the first select memory cell responsive to receiving a suspension command indicative of executing the read operation on the second select memory cell. The solution disclosed herein may initiate the read operation on the second select memory cell by sensing each portion of page data from the second select memory cell, where a piece of N-bits data including N portions of page data is stored in the second select memory cell, and N is a positive integer greater than 1. For example, before reading out each portion of page data from the second select memory cell, the solution disclosed herein can initially control the SO node and the cache storage unit of the page buffer circuit to prepare for sensing the portion of page data (e.g., the SO node can be pre-charged and the cache storage unit can be initialized). Next, the solution disclosed herein can control the SO node and the cache storage unit to sense the portion of page data from the second select memory cell based on a plurality of read times and a plurality of sensing levels associated with the portion of page data.

After the read operation is completed, the program operation can be resumed through the page buffer circuit since all the suspended program information associated with the program operation is stored in the page buffer circuit. Thus, the program-operation suspension feature can be supported by the memory device under the non-destructive mode through the usage of the SO node and the cache storage unit for the read operation. As a result, there is no need to add any additional storage unit to the page buffer circuit for supporting the program-operation suspension feature under the non-destructive mode in the solution disclosed herein.

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104. In order to send or receive data to or from memory devices 104, host 108 can send instructions to memory system 102 besides the data.

Memory device 104 can be any memory device disclosed in the present disclosure. As disclosed below in detail, memory device 104, such as a NAND Flash memory device, can support program operation suspension triggered by an interrupt. Memory device 104 can include memory cells, for example, in NAND memory strings.

Consistent with some aspects of the present disclosure, in some implementations, memory device 104 may suspend an ongoing program operation responsive to an interruption by a read operation on memory device 104. Memory device 104 may store suspended program information associated with the program operation. With respect to a select row of memory cells on which the read operation is performed, memory device 104 may utilize SO nodes and cache storage units of page buffer circuits coupled to the select row of memory cells to perform the read operation. When the read operation is completed, memory device 104 may resume the program operation using the suspended program information. Memory device 104 is described below in more detail with reference to FIGS. 2A-6C and 8-11.

Memory controller 106 is coupled to memory device 104, and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. For example, based on the instructions received from host 108, memory controller 106 may transmit various commands to memory device 104, e.g., a program command, a read command, an erase command, etc., to control the operations of memory device 104.

Consistent with some aspects of the present disclosure, in some implementations, memory controller 106 transmits a program command to memory device 104 to initiate the program operation performed by memory device 104. During the ongoing program operation, interrupts/suspensions can occur, for example, from host 108, and memory controller 106 can be configured to transmit one or more suspension commands to memory device 104 to cause one or more suspensions during the program operation. In some implementations, once the other operation triggered by each suspension (e.g., a read operation) is completed, memory controller 106 can be further configured to transmit a resume command to memory device 104 to resume the suspended program operation. Memory controller 106 is described below in more detail with reference to FIG. 7.

Memory controller 106 can also be configured to manage various functions with respect to the data stored or to be stored in memory device 104 including, but not limited to, bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
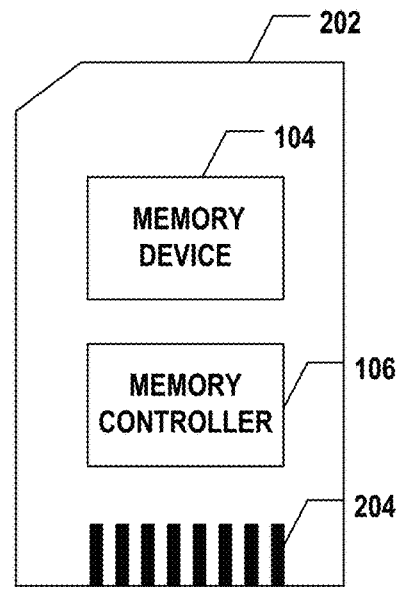
FIG. 2A illustrates a diagram of a memory card having a memory device, according to some aspects of the present disclosure.
Figure 2B:
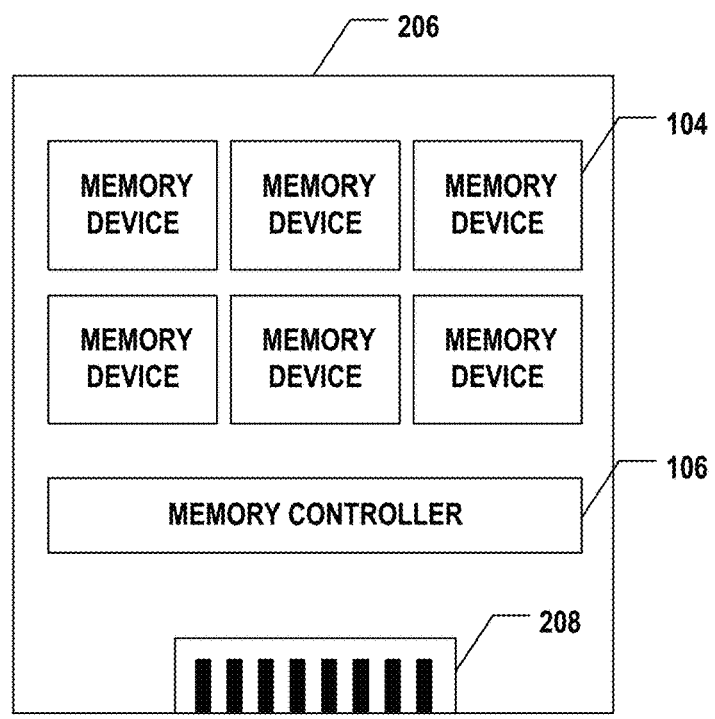
FIG. 2B illustrates a diagram of a solid-state drive (SSD) having a memory device, according to some aspects of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 configured to couple memory card 202 to a host (e.g., host 108 in FIG. 1). In another example as shown in FIG. 2B, memory controller 106 and multiple memory devices 104 may be integrated into an SSD 206. SSD 206 can further include an SSD connector 208 configured to couple SSD 206 to a host (e.g., host 108 in FIG. 1). In some implementations, the storage capacity and/or the operation speed of SSD 206 is greater than those of memory card 202.

Figure 3:
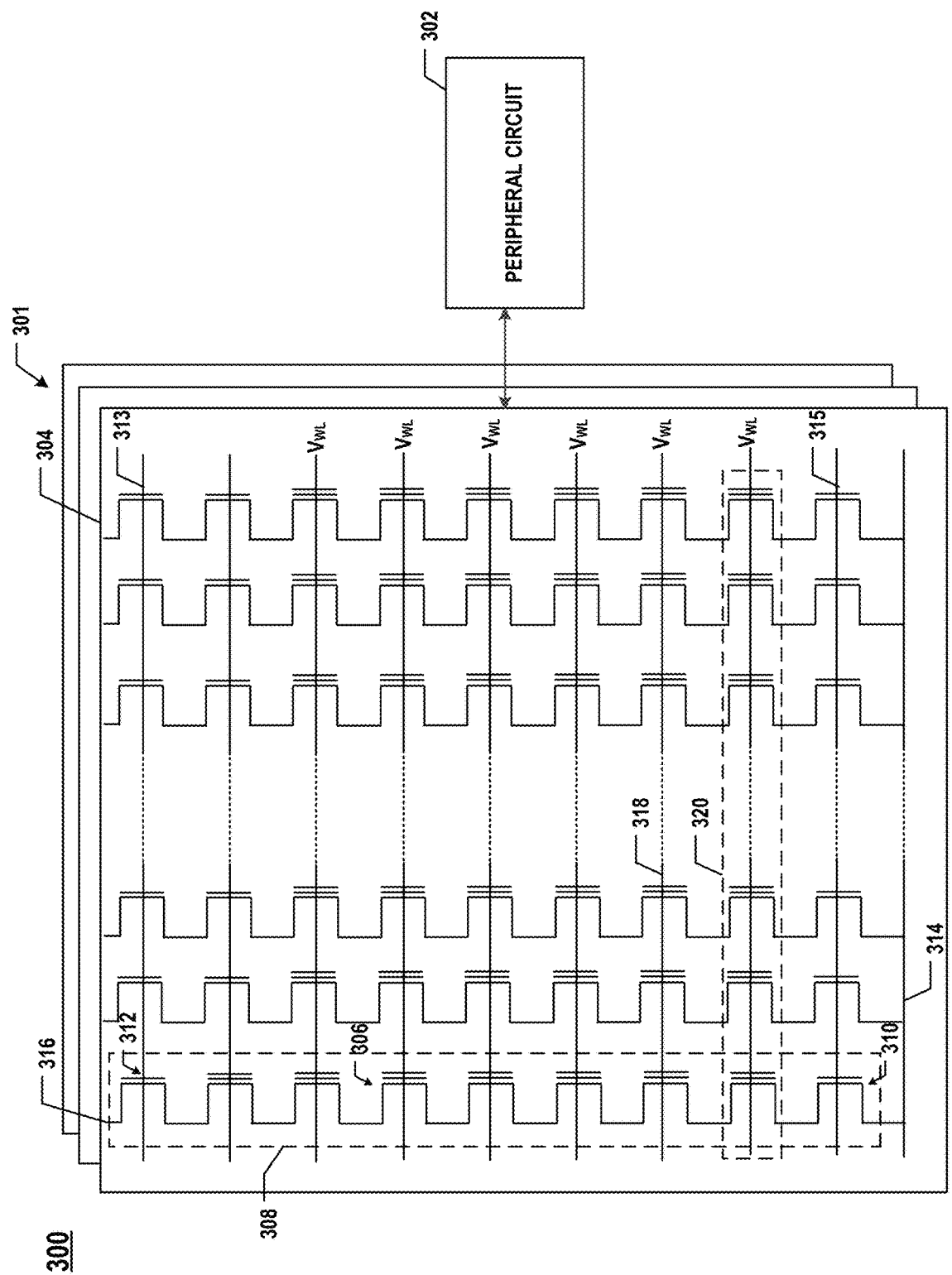
FIG. 3 illustrates a schematic diagram of a memory device including peripheral circuits, according to some aspects of the present disclosure.

FIG. 3 illustrates a schematic circuit diagram of an exemplary memory device 300 including peripheral circuits 302, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as TLC), or four bits per cell (also known as QLC). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3, each NAND memory string 308 can also include a source select gate (SSG) transistor 310 at its source end and a drain select gate (DSG) transistor 312 at its drain end. SSG transistor 310 and DSG transistor 312 can be configured to activate select NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (AC S), according to some implementations. The drain of each NAND memory string 308 is coupled to a respective bit line 316 from which data can be read or written via an output bus (not shown), according to some implementations. In some implementations, each NAND memory string 308 is configured to be selected or deselected by applying a DSG select voltage or a DSG unselect voltage to the gate of respective DSG transistor 312 through one or more DSG lines 313 and/or by applying an SSG select voltage or an SSG unselect voltage to the gate of respective SSG transistor 310 through one or more SSG lines 315.

As shown in FIG. 3, NAND memory strings 308 can be organized into multiple blocks 304, each of which can have a common source line 314, e.g., coupled to an ACS. In some implementations, each block 304 is the basic data unit for erase operations, i.e., all memory cells 306 on the same block 304 are erased at the same time. To erase memory cells 306 in a select block 304, source lines 314 coupled to select block 304 as well as unselect blocks 304 in the same plane as select block 304 can be biased with an erase voltage (Vers), such as a high positive voltage (e.g., 20 V or more). Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program and read operations. The size of one page 320 in bits can relate to the number of NAND memory strings 308 coupled by word line 318 in one block 304. Each word line 318 can include a plurality of control gates (gate electrodes) at each memory cell 306 on respective page 320 and a gate line coupling the control gates.

Figure 4A:
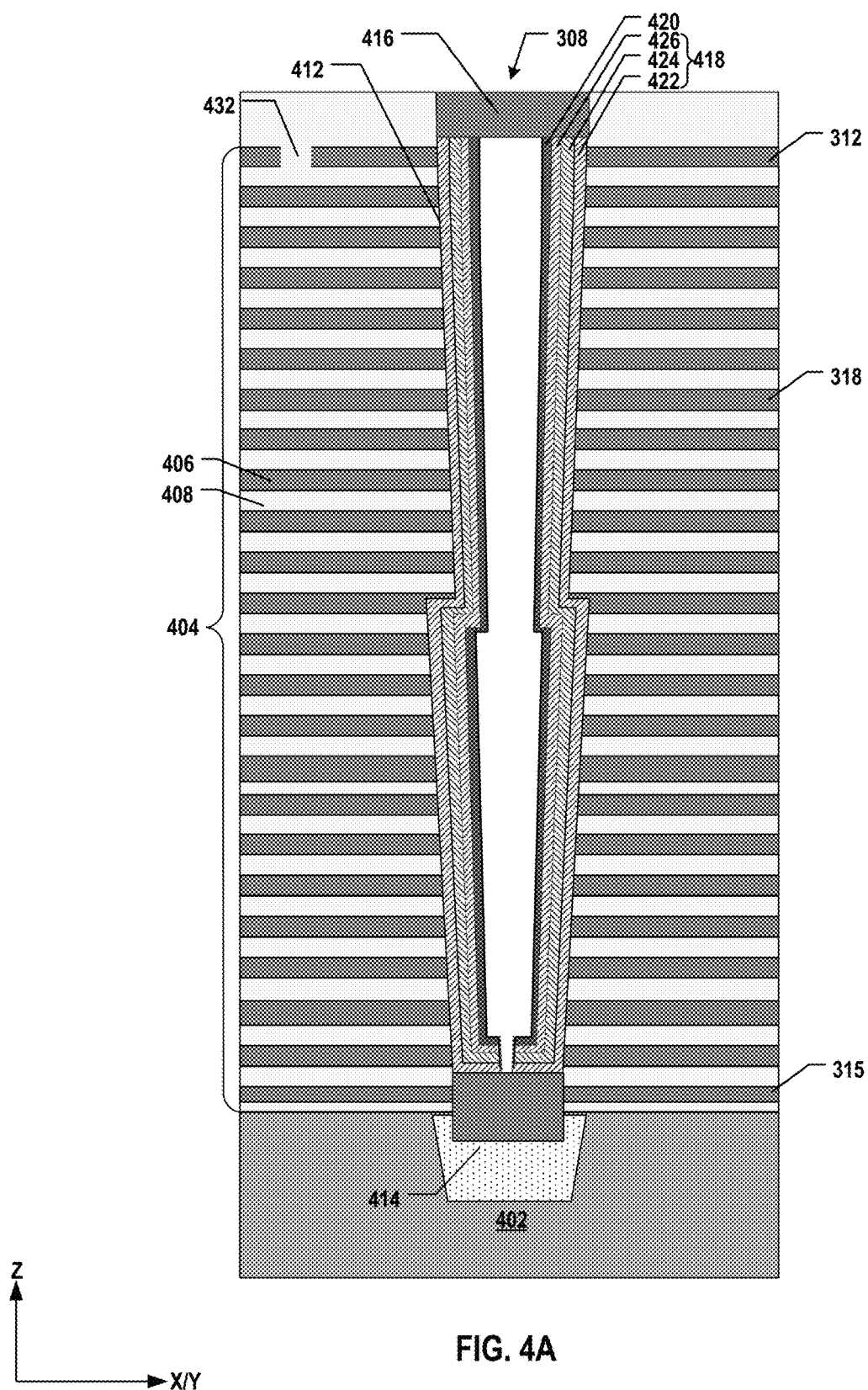
FIGS. 4A and 4B illustrate a side view and a plan view of cross-sections of a memory cell array including a NAND memory string, respectively, according to some aspects of the present disclosure.
Figure 4B:
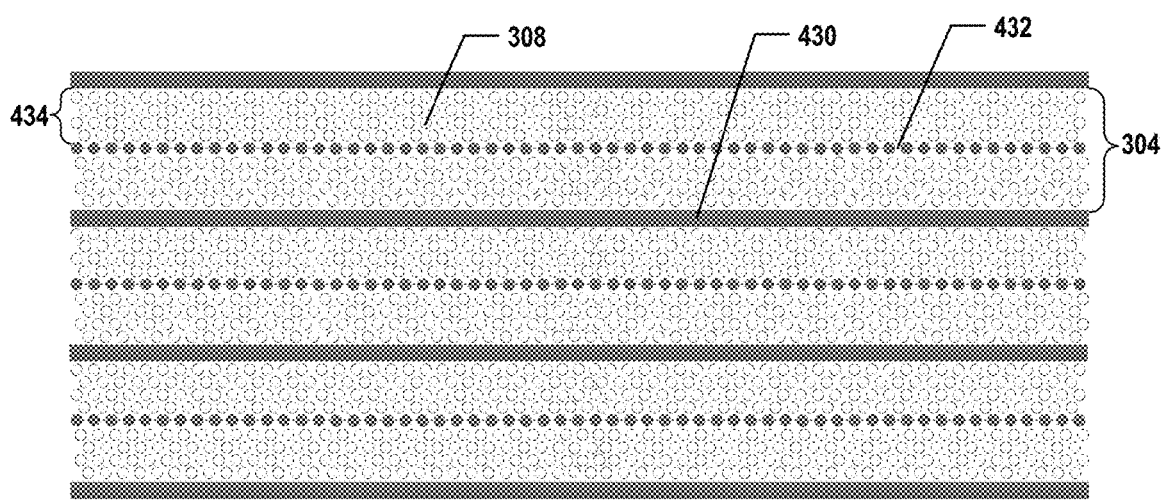

FIGS. 4A and 4B illustrate a side view and a plan view of cross-sections of an exemplary memory cell array 301 including NAND memory strings 308, respectively, according to some aspects of the present disclosure. As shown in FIG. 4A, NAND memory string 308 can extend vertically through a memory stack 404 above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials. It is noted that x, y, and z axes are included in FIG. 4A to further illustrate the spatial relationship of the components in a memory device. Substrate 402 includes two lateral surfaces extending laterally in the x-y plane: a top surface on the front side of the wafer on which the memory device can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the memory device is determined relative to substrate 402 of the memory device in the z-direction (the vertical direction perpendicular to the x-y plane) when substrate 402 is positioned in the lowest plane of the memory device in the z-direction. The same notion for describing the spatial relationships is applied throughout the present disclosure.

Memory stack 404 can include interleaved gate conductive layers 406 and gate-to-gate dielectric layers 408. The number of the pairs of gate conductive layers 406 and gate-to-gate dielectric layers 408 in memory stack 404 can determine the number of memory cells 306 in memory cell array 301. Gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include the control gates of memory cells 306, the gates of DSG transistors 312, or the gates of SSG transistors 310, and can extend laterally as DSG line 313 in the upper portion of memory stack 404, SSG line 315 in the lower portion of memory stack 404, or word line 318 between DSG line 313 and SSG line 315. It is understood that although one SSG line 315 and one DSG line 313 are shown in FIG. 4A, the number of SSG lines 315 and the number of DSG lines 313 (as well as the numbers of SSG transistors 310 and DSG transistors 312 coupled to the SSG lines 315 and DSG lines 313, respectively) may vary in other examples.

As shown in FIG. 4A, NAND memory string 308 includes a channel structure 412 extending vertically through memory stack 404. In some implementations, channel structure 412 includes a channel opening filled with semiconductor material(s) (e.g., as a semiconductor channel 420) and dielectric material(s) (e.g., as a memory film 418). In some implementations, semiconductor channel 420 includes silicon, such as polysilicon. In some implementations, memory film 418 is a composite dielectric layer including a tunneling layer 426, a storage layer 424 (also known as a "charge trap layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 may include a composite layer of silicon oxide/silicon oxynitride/silicon oxide (ONO).

As shown in FIG. 4A, a well 414 (e.g., a P-well and/or an N-well) is formed in substrate 402, and the source of NAND memory string 308 is in contact with well 414, according to some implementations. For example, source line 314 may be coupled to well 414 to apply an erase voltage to well 414, i.e., the source of NAND memory string 308, during erase operations. In some implementations, NAND memory string 308 further includes a channel plug 416 at the drain end.

As shown in the plan view of FIG. 4B, NAND memory strings 308 of memory cell array 301 can be arranged into blocks 304 by slit structures 430 (e.g., gate line slits (GLSs)), which electrically separate word lines 318 between adjacent blocks 304, such that each block 304 can be individually controlled in read, program, and erase operations. In one example, each slit structure 430 may extend along the x-direction (e.g., the word line direction), and multiple blocks 304 may be arranged along the y-direction (e.g., the bit line direction). In some implementations, each block 304 can be further divided into smaller areas (e.g., fingers 434) by DSG cuts 432, which electrically separate DSG lines 313 between adjacent fingers 434, such that DSG lines 313 in different fingers 434 may be individually controlled in read and program operations.

Figure 5A:
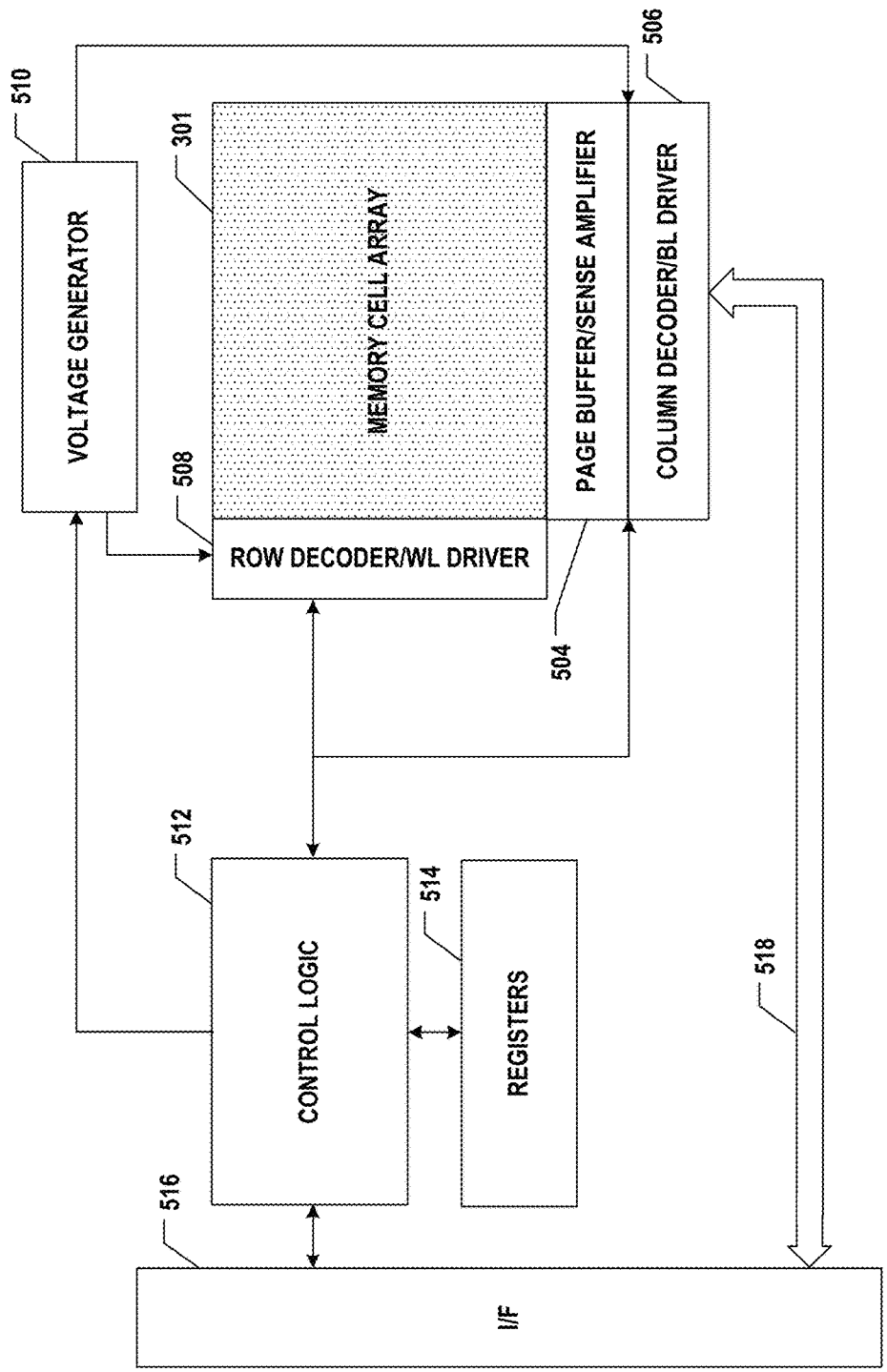
FIG. 5A illustrates a block diagram of a memory device including a memory cell array and peripheral circuits, according to some aspects of the present disclosure.

Referring back to FIG. 3, peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target (select) memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 5A illustrates some exemplary peripheral circuits including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5A may be included as well.

Page buffer/sense amplifier 504 can be configured to read and program (write) data from and to memory cell array 301 according to the control signals from control logic 512. In one example, page buffer/sense amplifier 504 may store one page of program data (write data) to be programmed into one page 320 of memory cell array 301. In another example, page buffer/sense amplifier 504 may perform program verify operations to ensure that the data has been properly programmed into select memory cells 306 coupled to select word lines 318. In still another example, page buffer/sense amplifier 504 may also sense the low power signals from bit line 316 that represents a data bit value stored in memory cell 306 and amplify the small voltage swing to recognizable logic levels in a read operation. Column decoder/bit line driver 506 can be configured to be controlled by control logic 512 and select one or more NAND memory strings 308 by applying bit line voltages generated from voltage generator 510.

Row decoder/word line driver 508 can be configured to be controlled according to the control signals by control logic 512 and select/unselect blocks 304 of memory cell array 301 and select/unselect word lines 318 of block 304. Row decoder/word line driver 508 can be further configured to drive word lines 318 using word line voltages generated from voltage generator 510. In some implementations, row decoder/word line driver 508 can also select/deselect and drive SSG lines 315, and DSG lines 313 as well using SSG voltages and DSG voltages generated from voltage generator 510.

Voltage generator 510 can be configured to be controlled by control logic 512 and generate the various word line voltages (e.g., read voltage, program voltage, pass voltage, verification voltage), SSG voltages (e.g., select/unselect voltages), DSG voltages (e.g., select/unselect voltages), bit line voltages (e.g., ground voltage), and source line voltages (e.g., ground voltage) to be supplied to memory cell array 301.

Control logic 512 can be coupled to each peripheral circuit described above and configured to control the operations of each peripheral circuit. Registers 514 can be coupled to control logic 512 and include status registers, command registers, and address registers for storing status information, command operation codes (OP codes), and command addresses for controlling the operations of each peripheral circuit.

In some implementations, control logic 512 can receive a program command issued by a memory controller (e.g., memory controller 106 in FIG. 1) and send control signals to various peripheral circuits, such as row decoder/word line driver 508, column decoder/bit line driver 506, and voltage generator 510 to initiate the program operation on select memory cells 306 coupled to select word line 318. In response to receiving a suspension command issued by the memory controller during the ongoing program operation, control logic 512 can send control signals to various peripheral circuits, such as row decoder/word line driver 508, column decoder/bit line driver 506, and voltage generator 510, to suspend the program operation and initiate another operation triggered by the suspension command (e.g., a read operation). In some implementations, registers 514 are configured to store the information of the suspended program operation, such as the programming page, the program pass, and the program/verify cycle at which the program operation is suspended, etc., which is needed for resuming the suspended program operation. In some implementations, control logic 512 is configured to check the status of the other operation from status registers of registers 514. In response to completion of the other operation (e.g., read operation), control logic 512 is further configured to retrieve the information of the suspended program operation stored in registers 514 and send control signals to various peripheral circuits, such as row decoder/word line driver 508, column decoder/bit line driver 506, and voltage generator 510 to resume the suspended program operation based on the retrieved information from registers 514, according to some implementations. Control logic 512 is described below in more detail with reference to FIGS. 6A-6C and 8-11.

Interface 516 can be coupled to control logic 512 and act as a control buffer to buffer and relay control commands (e.g., program command and suspension command) received from a memory controller (e.g., memory controller 106 in FIG. 1) to control logic 512 and information received from control logic 512 to the memory controller. Interface 516 can also be coupled to column decoder/bit line driver 506 via data bus 518 and act as a data input/output (I/O) interface and a data buffer to buffer and relay the data to and from memory cell array 301.

Each memory cell 306 in memory cell array 301 can be configured to store a piece of N-bits data in one of $2^N$ levels, where N is an integer greater than 1 (e.g., N=2 for MLCs, N=3 for TLCs, N=4 for QLCs, etc.). The N-bits data may include $2^N$ pieces of data in $2^N$ levels, respectively. Each level can correspond to one of $2^N$ threshold voltage (Vth) ranges of memory cells 306. Taking TLCs, where N=3, for example, memory cell 306 may be programmed into one of 8 levels, including one level of the erased state and 7 levels of the programmed states. Each level may correspond to a respective threshold voltage (Vth) range of memory cells 306. For example, the level corresponding to the lowest threshold voltage range may be considered as level 0, the level corresponding to the second-lowest threshold voltage range may be considered as level 1, and so until level 7 corresponding to the highest threshold voltage range.

On the other hand, each level can correspond to one of the $2^N$ pieces of N-bits data that is to be stored in select memory cell 306. In some implementations, the $2^N$ pieces of N-bits data may be represented by (in the form of) a gray code. A gray code (a.k.a., reflected binary code (RBC) or reflected binary (RB)) is an ordering of the binary numeral system such that two successive values differ in only one bit (binary digit). For example, Table 1 of FIG. 5B shows an example of a binary code representing a one-to-one mapping between 8 levels (LV 0 to LV 7) and 8 pieces of 3-bits data. As shown in Table 1, each piece of 3-bits data may include three bits of binary values (b1, b2, and b3). In one example, level 1 may correspond to a piece of 3-bits data having a value of 001. In another example, level 7 may correspond to another piece of 3-bits data having a value of 100.

Also referring to FIG. 5A, in a program operation, a data page having N pages (a.k.a. pieces) of the N-bits data can be used to program a select row of memory cells 306 coupled to select word line 318. In other words, peripheral circuits 302 can be configured to program a select row of memory cells 306 based on a current data page. The current data page has N pieces of the N-bits data (e.g., a total of N×N bits), and each piece of the N-bits data includes N bits from the current data page. In some implementations, user data is transmitted through data bus 518 to page buffer/sense amplifier 504, and page buffer/sense amplifier 504 is configured to convert the user data into each data page to be programmed into a respective row of memory cells 306 based on a preset gray code. Based on the preset gray code, which defines the mapping of each programmed level and a respective piece of N-bits data, control logic 512 is configured to send control signals (e.g., enable signals) to page buffer/sense amplifier 504 to allow page buffer/sense amplifier 504 to generate corresponding data pages for respective program operations. During the ongoing program operation, the current data page can be temporarily stored in page buffer/sense amplifier 504, and page buffer/sense amplifier 504 can be configured to provide to each memory cell 306 (coupled to select word line 318) the corresponding piece of N-bits data through the corresponding bit line 316. The corresponding piece of N-bits data may include N portions of page data (e.g., N bits from the current data page, with each portion of page data corresponding to a respective bit of the N bits from the current data page).

For example, for N=3, a select row of memory cells 306 (e.g., a page) may include 3 select memory cells 306 coupled to select word line 318. The current data page may include 3 pieces of the 3-bits data including, e.g., 110 (the first piece of the 3-bits data), 001 (the second piece of the 3-bits data), and 101 (the third piece of the 3-bits data). During the ongoing program operation on select row of memory cells 306, level 4 corresponding to 110, level 1 corresponding to 001, and level 6 corresponding to 101 are programmed into the 3 select memory cells 306, respectively. In this example, each of the first, second, or third piece of the 3-bits data may include 3 portions of page data, with each portion of page data corresponding to a respective bit of the corresponding 3 bits from the first, second, or third piece of the 3-bits data.

Also referring to FIG. 5A, in a read operation, a data page having N pieces of the N-bits data stored in a select row of memory cells 306 coupled to select word line 318 can be read out from select row of memory cells 306 though corresponding bit lines 316. For example, control logic 512 is configured to send control signals (e.g., enable signals) to page buffer/sense amplifier 504 (and any other suitable peripheral circuit) to allow page buffer/sense amplifier 504 to read the data page from select row of memory cells 306 and output the data page to I/O 516.

Figure 6A:
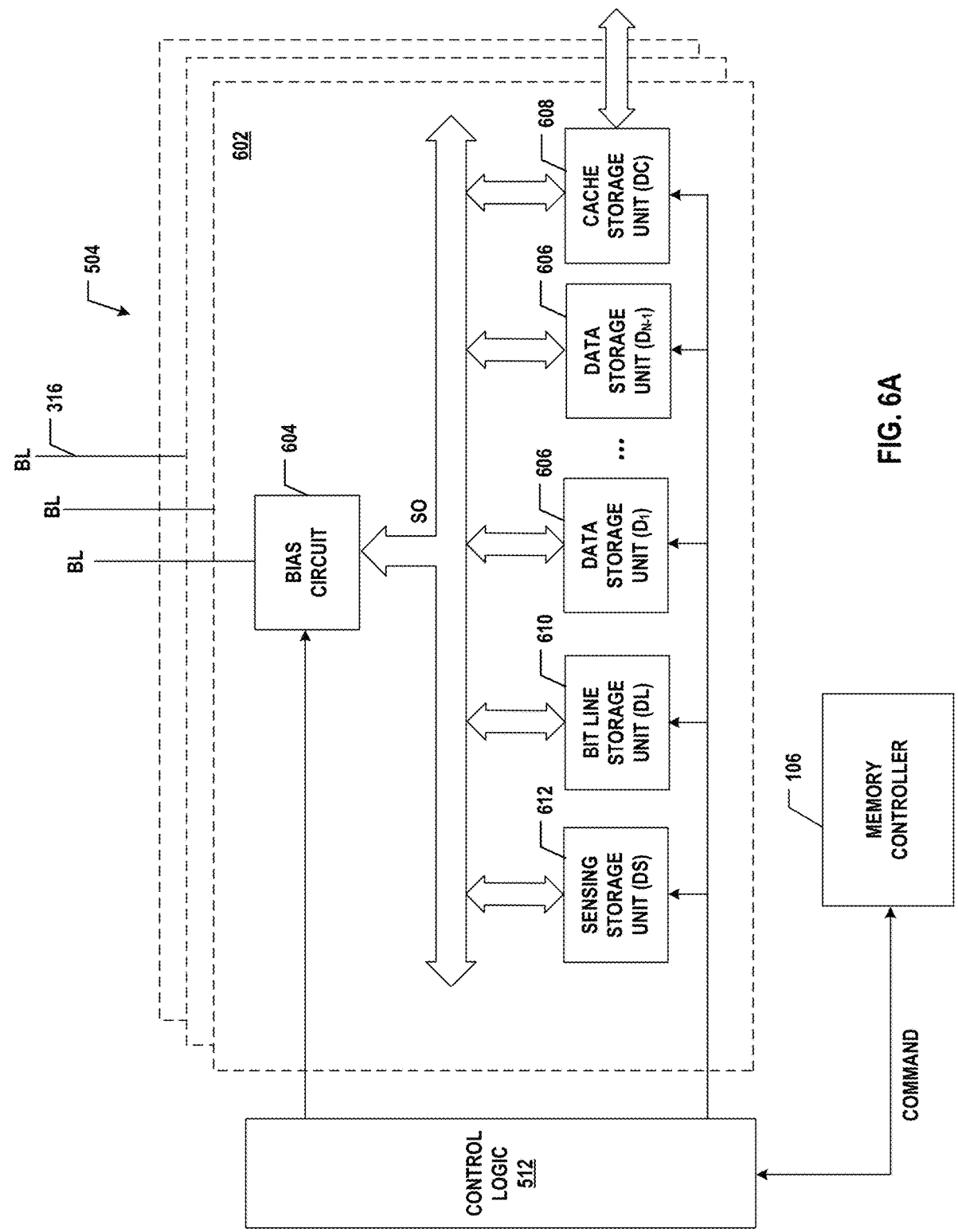
FIG. 6A illustrates a detailed block diagram of an exemplary structure of a page buffer, according to some aspects of the present disclosure.

FIG. 6A illustrates a detailed block diagram of an exemplary structure of a page buffer (e.g., page buffer/sense amplifier 504), according to some aspects of the present disclosure. In some implementations, the page buffer in FIG. 6A includes a plurality of page buffer circuits 602 each coupled to a respective one of bit lines 316. In other words, each page buffer circuit 602 can be coupled to a respective column of memory cells 306 (e.g., NAND memory string 308) through a corresponding bit line 316 and configured to temporarily store a piece of N-bits data that is used for programming a respective select memory cell 306 (coupled to select word line 318 and the corresponding bit line 316) in a program operation. All page buffer circuits 602 together can temporarily store the entire current data page (e.g., N pieces of the N-bits data) that are used for programming select row of memory cells 306 (e.g., a page 320 of memory cells 306) coupled to select word line 318 in the program operation. As described above, in some implementations, each page buffer circuit 602 is also configured to pre-process a respective portion of the user data received from data bus 518 and convert it to the corresponding piece of N-bits data based on a preset gray code. The corresponding piece of N-bits data may include N portions of page data (e.g., N bits from the current data page). For example, for TLCs where N=3, each page buffer circuit 602 may be configured to temporarily store a respective set of the 8 sets of 3 bits of the current data page as shown in Table 1 of FIG. 5B, which correspond to 8 levels, respectively.

In some implementations, each page buffer circuit 602 can include a plurality of storage units and a bias circuit 604. The plurality of storage units may include N−1 data storage units ($D_1, \ldots, D_{N-1}$) 606, a cache storage unit (DC) 608, a bit line (BL) storage unit (DL) 610, and a sensing storage unit (DS) 612.

During the ongoing program operation for programming a select row of memory cells 306 based on a current data page, each of N−1 data storage units 606 can be configured to store a respective portion of page data from the piece of the N-bits data (e.g., a respective bit of the corresponding N bits from the current data page). As a result, N−1 data storage units 606 can store N−1 portions of page data from the piece of the N-bits data (e.g., N−1 bits of the corresponding N bits from the current data page).

To reduce the number of storage units and the size of page buffer circuit 602, the number of cache storage unit 608 is limited to one, i.e., a single cache storage unit 608 that can store only a single bit of data at the same time, according to some implementations. Existing multi-cache data loading schemes may require the number of data storage units in each page buffer circuit 602 to be at least the same as the number of bits in the piece of N-bits data used for programming the corresponding select memory cell 306, i.e., N data storage units, because the single cache storage unit is dedicated to caching the data of the next data page. Different from the existing schemes and consistent with the scope of the present disclosure, the single cache storage unit 608 in page buffer circuit 602 in FIG. 6A can also be configured to store one of the corresponding N bits from the current data page. That is, cache storage unit 608 is configured to sequentially store one of the corresponding N bits from the current data page and each of the corresponding N bits from the next data page, according to some implementations. In other words, cache storage unit 608 can act as both a data storage unit and a cache storage unit in a time-division manner to replace one of data storage units 606 in each page buffer circuit 602. In some implementations, as shown in FIG. 6A, the number of data storage units 606 in each page buffer circuit 602 thus becomes N−1 ($D_1$ to $D_{N-1}$). The total number of data storage units 606 and cache storage unit 608 thus can be reduced from N+1 to N, compared with the existing multi-cache data loading schemes.

It is understood that a total of N−1 data storage units 606 and cache storage unit 608 may reduce the data loading window by caching N−1 bits of the N bits of the next data page in programming the current select row of memory cells based on the current data page, but may not be able to completely avoid the data loading window. Thus, consistent with the scope of the present disclosure, in some implementations, another storage unit in each page buffer circuit 602 for storing non-data page information is configured to sequentially store the non-data page information and one of the N bits of the next data page, thereby enabling the caching of all N−1 bits of the next data page in the current program operation to avoid the data loading windows. That is, page buffer circuit 602 can include a multipurpose storage unit that can store the non-data page information and cache the data of the next data page in a time-division manner.

In some implementations, sensing storage unit (DS) 612 and BL storage unit (DL) 610 may be configured to store non-data page information, i.e., any information other than the data bits in a data page. For example, sensing storage unit (DS) 612 may be configured to store information indicative of whether the current operation performed by page buffer/sense amplifier 504 is a read operation or a program operation. BL storage unit (DL) 610 (e.g., a 3BL storage unit) may be configured to store the bias information of the respective bit line 316 coupled to page buffer circuit 602. In some implementations, BL storage unit 610 may be a multipurpose storage unit that acts as both a BL storage unit and a cache storage unit in a time-division manner. Bias circuit 604 may be coupled to a respective bit line 316 and configured to apply a bit line voltage to corresponding select memory cell 306 coupled to a respective bit line 316 in the program operation. Depending on whether the corresponding select memory cell 306 passes the verification at the respective level according to the N-bits of data for programming the select memory cell 306, for example, a high voltage level and a low voltage level, can be used as the bit line voltage to bias the respective bit line 316. In some implementations, to optimize the threshold voltage distributions, for example, enlarging the read margins between adjacent levels and reducing the width of each level, a medium voltage level is used as well for biasing the bit line voltage. That is, three voltage levels, e.g., high, medium, and low, can be applied to the respective bit line 316 (referred to herein as 3BL). In some implementations, a voltage level applied to the respective bit line 316 (e.g., 3BL bias) is non-data page information stored in BL storage unit 610.

It is understood that although BL storage unit 610 is described herein as an example of the multipurpose storage unit, any suitable non-data page storage units in page buffer circuit 602, such as sensing storage unit 612, or any other non-data page storage units not shown in FIG. 6A, may be used as the multipurpose storage unit in some examples without adding additional storage units into page buffer circuit 602. It is also understood that each storage unit in page buffer circuit 602, including each data storage unit 606, cache storage unit 608, BL storage unit 610, and sensing storage unit 612, may be any circuit that has two stable states for storing a single bit of data, such as a latch or a flip-flop. In one example, each of data storage units 606, cache storage unit 608, BL storage unit 610, and sensing storage unit 612 may include a latch. In some implementations, page buffer circuit 602 has a 5-latch configuration that includes one cache latch, two data latches, one 3BL latch, and one sensing latch for a TLC memory device. In some implementations, page buffer circuit 602 has a 6-latch configuration that includes one cache latch, three data latches, one 3BL latch, and one sensing latch for a QLC memory device.

An exemplary process for initiating a read operation during a suspension of a program operation under a non-destructive mode is illustrated herein with reference to FIG. 6A. Initially, control logic 512 may receive a program command from memory controller 106 to initiate a program operation on a first select row of memory cells 306 (including a first memory cell 306). If a read command to execute a read operation on a second select row of memory cells 306 (including a second memory cell 306) is issued to interrupt the program operation, control logic 512 may receive a suspension command issued by memory controller 106. The suspension command may indicate to suspend the ongoing program operation on first select row of memory cells (including first memory cell 306) and to initiate the read operation on second select row of memory cells 306 (including second memory cell 306). First and second memory cells 306 may be in the same NAND memory string 308 and coupled to the same page buffer circuit 602 through the same bit line 316. Then, control logic 512 can send control signals to various peripheral circuits, such as row decoder/word line driver 508, column decoder/bit line driver 506, and voltage generator 510, to suspend the program operation and initiate the read operation triggered by the suspension command.

Specifically, control logic 512 may be configured to suspend the program operation on first select row of memory cells 306 (including first memory cell 306) responsive to receiving the suspension command indicative of executing the read operation on second select row of memory cells 306 (including second memory cell 306). Control logic 512 may control page buffer circuit 602 to store suspended program information associated with the suspended program operation.

For example, the program operation may be configured to write a piece of N-bits data at one of $2^N$ levels to first memory cell 306, where the piece of N-bits data includes N portions of page data (e.g., N bits from the current data page). The suspended program information may include N+1 pieces of program information (e.g., including inhibit information and the N portions of page data) associated with the program operation. The inhibit information may include any non-data page information associated with the program operation and can be used to resume the program operation on first memory cell 306 when the read operation completes. For example, the inhibit information may indicate whether a program verification on first memory cell 306 has passed or not. Control logic 512 may control page buffer circuit 602 to store the N portions of page data and the inhibit information in N+1 storage units (e.g., including sensing storage unit 612, BL storage unit 610, and N−1 data storage units 606). In this case, cache storage unit 608 is in an idle state. Exemplary suspended program information stored in page buffer circuit 602 is illustrated below in more detail with reference to FIG. 8.

Figure 6B:
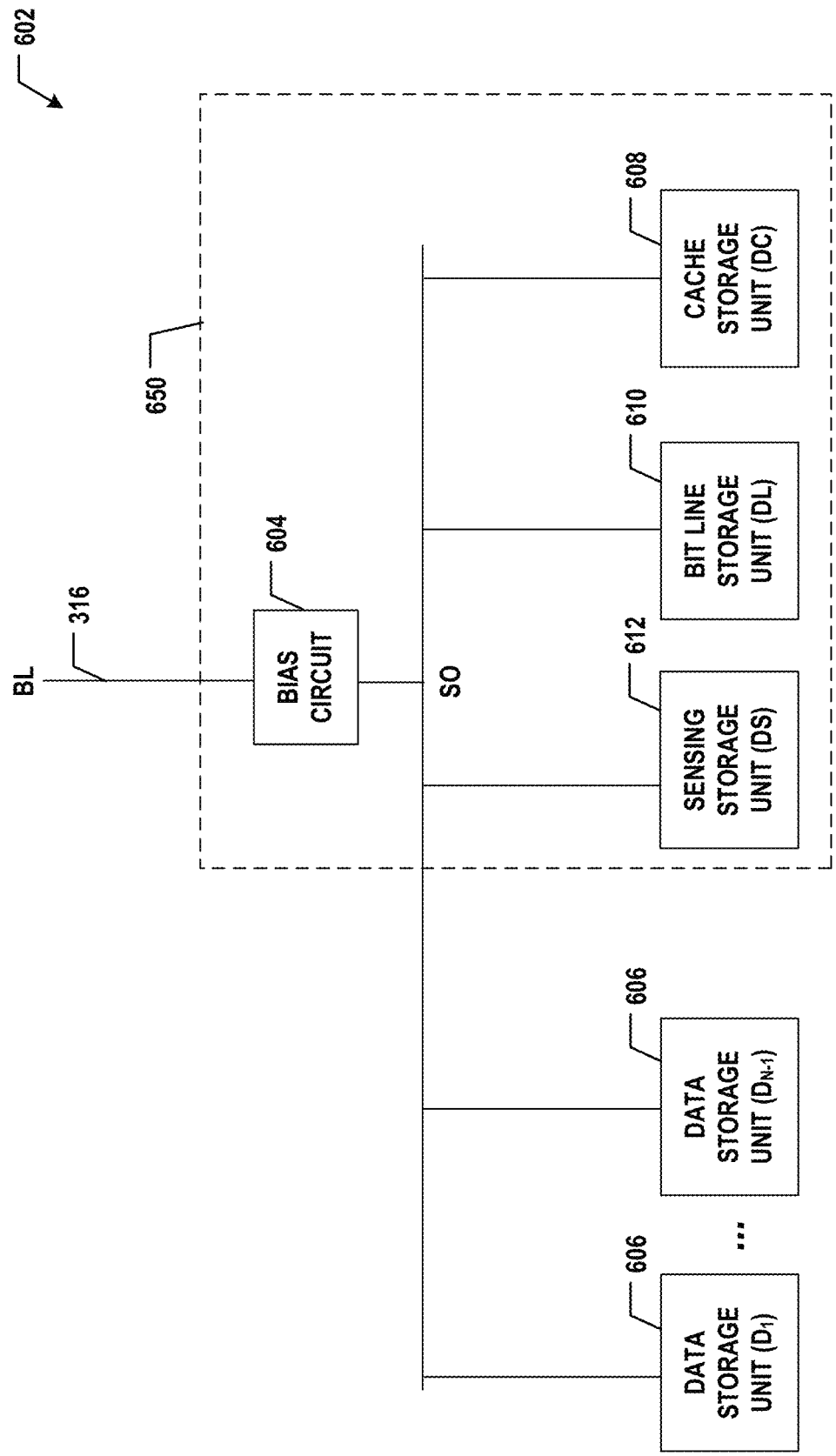
FIG. 6B illustrates a detailed block diagram of an exemplary structure of a page buffer circuit, according to some aspects of the present disclosure.
Figure 6C:
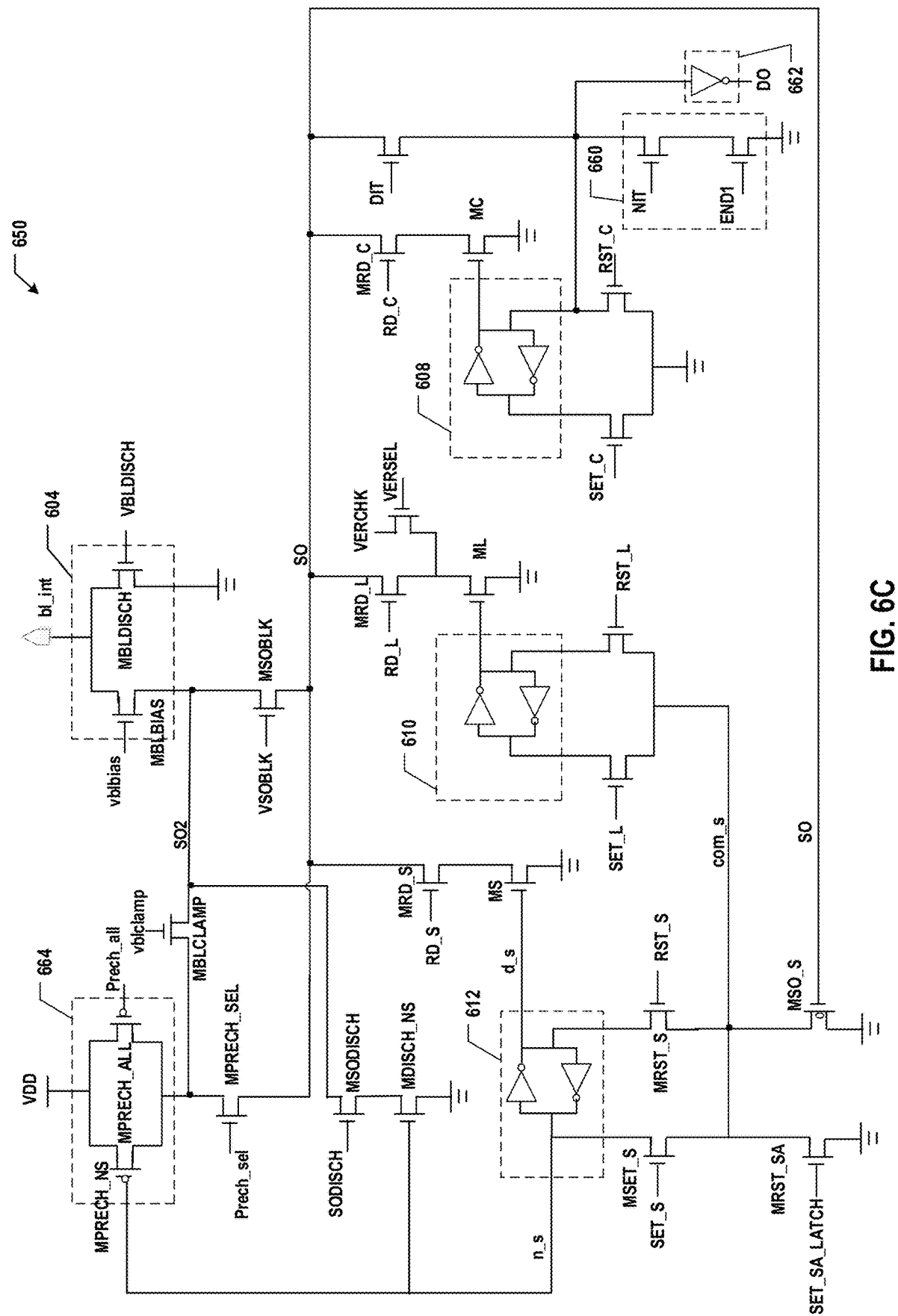
FIG. 6C illustrates a circuit diagram of a portion of the page buffer circuit in FIG. 6B, according to some aspects of the present disclosure.

Next, responsive to cache storage unit 608 being in an idle state, control logic 512 may be configured to initiate the read operation on second memory cell 306 through cache storage unit 608 and an SO node of page buffer circuit 602. The SO node of page buffer circuit 602 can be a sense out node that couples to at least one of bias circuit 604, sensing storage unit 612, BL storage unit 610, N−1 data storage units 606, or cache storage unit 608. For example, the SO node may be any node in a connection line that connects to each of bias circuit 604, sensing storage unit 612, BL storage unit 610, N−1 data storage units 606, or cache storage unit 608 (e.g., as shown in FIGS. 6B-6C).

In some applications (e.g., in a normal read operation without the suspension of the program operation), sensing storage unit 612 coupled to a NAND memory string 308 (including first and second memory cells 306) is configured to be optimized for sensing data (e.g., a voltage level) stored in first or second memory cell 306. Cache storage unit 608 is coupled to interface 516 to receive or send data from or to interface 516. Thus, sensing storage unit 612 may be used to sense the data stored in first or second memory cell 306 and forward the sensed data to cache storage unit 608, causing cache storage unit 608 to output the sensed data to interface 516. However, during the suspension of the ongoing program operation, sensing storage unit 612 is occupied by the suspension of the program operation. For example, sensing storage unit 612 may be used store one of the N portions of page data or the inhibit information during the suspension of the program operation, and cannot be used for performing the read operation. As a result, rather than using sensing storage unit 612, control logic 512 may initiate the read operation on second memory cell 306 through cache storage unit 608 and the SO node of page buffer circuit 602 as disclosed herein.

In some implementations, the read operation may be configured to read a piece of N-bits data at one of $2^N$ levels from second memory cell 306, where the piece of N-bits data includes N portions of page data. To initiate the read operation on second memory cell 306, control logic 512 may be configured to sense each of the N portions of page data from second memory cell 306 one by one through the SO node and cache storage unit 608, as described below in more detail. For example, the N portions of page data may include extra page (XP) data, upper page (UP) data, middle page (MP) data, and lower page (LP) data, respectively. Control logic 512 may be configured to read each of the XP data, the UP data, the MP data, and the LP data from second memory cell 306 one by one using the SO node and cache storage unit 608.

Consistent with certain aspects of the present disclosure, a working principle of the SO node is provided herein. It is noted that a parasitic capacitor may be present in the connection line of the SO node. When the SO node is pre-charged (or discharged), the parasitic capacitor in the connection line is pre-charged (or discharged). Then, if a sensing level (e.g., a sensing voltage level) is applied to a select memory cell coupled to page buffer circuit 602, the SO node is discharged correspondingly (e.g., the higher the sensing level is, the faster the SO node is discharged). Then, a respective portion of page data to be sensed from the select memory cell can be determined based on the bit value of the SO node.

Initially, in order to read each portion of page data from second memory cell 306, control logic 512 may control the SO node and cache storage unit 608 to prepare for sensing the portion of page data first. For example, control logic 512 may set cache storage unit 608 to initiate a sensing result stored in cache storage unit 608 (e.g., cache storage unit 608 may be initiated to store a bit value of "1"). Control logic 512 may also control page buffer circuit 602 to pre-charge the SO node (e.g., the SO node may be pre-charged to store a bit value of "1").

Next, control logic 512 may control the SO node and cache storage unit 608 to sense the portion of page data based on a plurality of read times associated with the portion of page data. In some implementations, control logic 512 may determine a plurality of read times associated with the portion of page data and a plurality of sensing levels for the plurality of read times, respectively. The plurality of read times and the plurality of sensing levels may be determined based on an operation scheme of the memory device. An exemplary operation scheme and its associated read times and sensing levels are illustrated below in more detail with reference to FIG. 9. Control logic 512 may control page buffer circuit 602 to apply the plurality of sensing levels to second memory cell 306, respectively, to update a sensing result stored in cache storage unit 608. For example, for each sensing level from the plurality of sensing levels, control logic 512 may control page buffer circuit 602 to apply the sensing level to second memory cell 306, so that the SO node is discharged. Then, control logic 512 may control page buffer circuit 602 to update the sensing result in cache storage unit 608 based on a data value stored in the SO node. After the sensing level is applied to second memory cell 306, control logic 512 may also control page buffer circuit 602 to pre-charge the SO node before applying a next sensing level to second memory cell 306. By applying the plurality of sensing levels to second memory cell 306 one by one, the sensing result stored in cache storage unit 608 can be updated incrementally.

After each of the plurality of sensing levels is applied to second memory cell 306, respectively, control logic 512 may page buffer circuit 602 to output the sensing result from cache storage unit 608 to interface 516 as the portion of page data. An exemplary process for reading (or sensing) a portion of page data (e.g., LP data) from a select memory cell is described below in more detail with reference to FIG. 9.

By performing operations like those described above, the N portions of page data stored in second memory cell 306 may be read out one by one through the SO node and cache storage unit 608. Thus, the read operation on second memory cell 306 is completed. Responsive to the completion of the read operation, control logic 512 may control page buffer circuit 602 to resume the program operation on first memory cell 306 using the suspended program information stored in page buffer circuit 602.

FIG. 6B illustrates a detailed block diagram of an exemplary structure of a page buffer circuit (e.g., page buffer circuit 602), according to some aspects of the present disclosure. In FIG. 6B, an output of bias circuit 604 is coupled to the SO node. N−1 data storage units 606, cache storage unit 608, sensing storage unit 612, and BL storage unit 610 are coupled to the SO node, respectively. A portion 650 of page buffer circuit 602 in FIG. 6B (including bias circuit 604, sensing storage unit 612, BL storage unit 610, and cache storage unit 608) is illustrated below in more detail with reference to FIG. 6C. In some implementations, each of N−1 data storage units 606 may have a structure like that of sensing storage unit 612, BL storage unit 610, or cache storage unit 608. Thus, the structures of N−1 data storage units 606 are not shown in FIG. 6C.

FIG. 6C illustrates a circuit diagram of a portion (e.g., portion 650) of page buffer circuit 602, according to some aspects of the present disclosure. Exemplary circuit structures of sensing storage unit 612, BL storage unit 610, cache storage unit 608, and bias circuit 604 are illustrated in FIG. 6C. Portion 650 of page buffer circuit 602 shown in FIG. 6C may also include an input circuit 660, a data-out (DO) buffer 662, and a pre-charge circuit 664. In some implementations, pre-charge circuit 664 may be operated in response to a pre-charge signal (e.g., Prech_all) to pre-charge the SO node. Input circuit 660 may be configured to receive programming data that is intended to be programmed into the memory device. For example, during a program operation, the programming data from interface 516 can be inputted into cache storage unit 608 via input circuit 660. For a read operation described herein, a sensing result stored in cache storage unit 608 can be outputted to interface 516 through data-out buffer 662.

Figure 7:
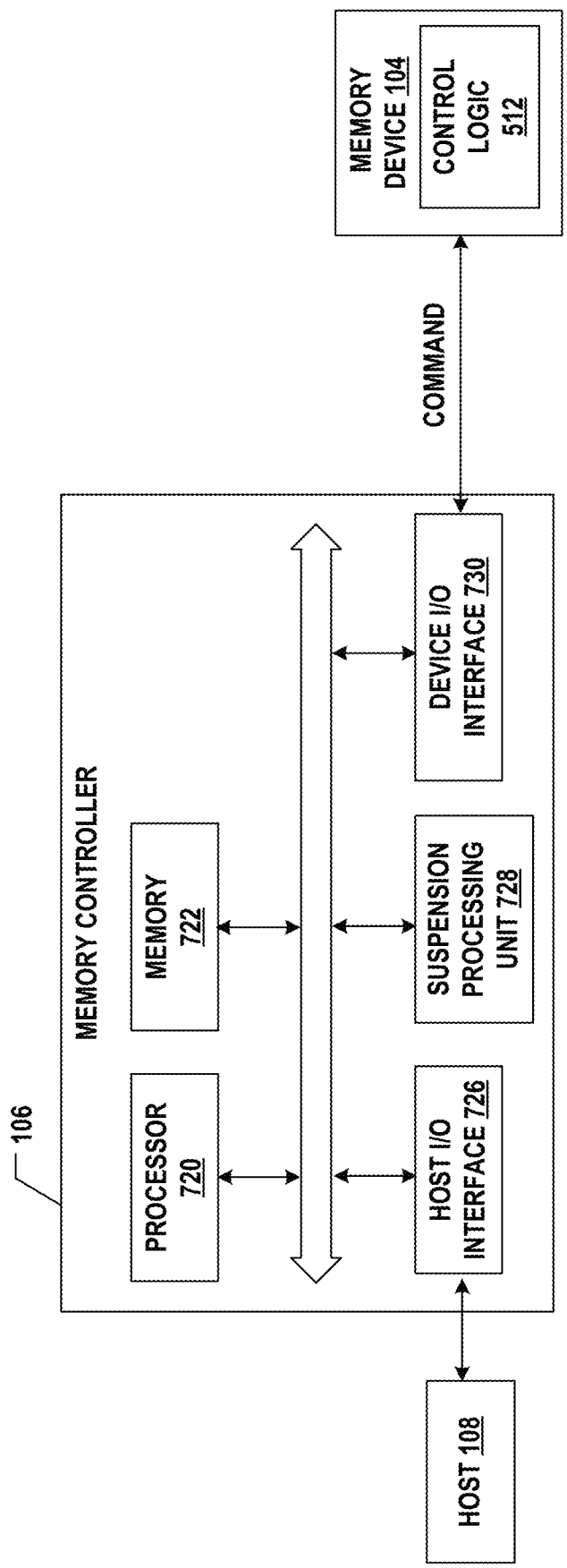
FIG. 7 illustrates a detailed block diagram of an exemplary structure of a memory controller, according to some aspects of the present disclosure.

FIG. 7 illustrates a detailed block diagram of an exemplary structure of a memory controller (e.g., memory controller 106), according to some aspects of the present disclosure. Memory controller 106 may include at least one of a processor 720, a memory 722, a host input/output (I/O) interface 726, a suspension processing unit 728, or a device I/O interface 730.

Processor 720 can be any suitable type of processors, for example, a central processing unit (CPU), a microprocessor, a system-on-chip (SoC), or an application processor (AP), etc. Processor 720 may include various computing architectures including a complex instruction set computer (CISC) architecture, a reduced instruction set computer (RISC) architecture, or an architecture implementing a combination of instruction sets. Although only a single processor is shown in FIG. 7, multiple processors may be included. Processor 720 can be configured to send or receive data to or from memory 722. For example, processor 720 can be configured to receive instructions from memory 722 and execute the instructions to provide the functionality described herein.

Memory 722 stores data that may include code or routines for performing part of or all of the techniques described herein. Memory 722 may be a dynamic random access memory (DRAM) device, a static random access memory (SRAM) device, a hard disk drive, a floppy disk drive, a CD-ROM device, a DVD-ROM device, a DVD-RAM device, a DVD-RW device, a flash memory device (e.g., NAND Flash memory device), or some other suitable memory device.

Host I/O interface 726 may be an interface that couples memory controller 106 to host 108. For example, host I/O interface 726 may include one or more of a network interface, a universal serial bus (USB), a parallel bus interface (PBI), a thunderbolt, or any other suitable type of interface capable of outputting or receiving data to or from host 108. Similarly, device I/O interface 730 may be an interface that couples memory controller 106 to memory device 104. For example, device I/O interface 730 may include any suitable type of interface capable of outputting or receiving data to or from memory device 104.

Suspension processing unit 728 may be coupled to the other components of memory controller 106, respectively. In some implementations, suspension processing unit 728 may be configured to send a command (e.g., a program command, a read command, or a suspension command) received from host 108 to control logic 512 of memory device 104 through device I/O interface 730. In some implementations, suspension processing unit 728 can be configured to handle a suspension of a program operation responsive to receiving a suspension command from host 108 via host I/O interface 726.

Specifically, suspension processing unit 728 may send the suspension command to control logic 512 of memory device 104 to suspend an ongoing program operation on a first memory cell 306 and to initiate a read operation on a second memory cell 306. First and second memory cells 306 are coupled to the same page buffer circuit 602 through the same bit line 316. Besides, responsive to the completion of the read operation on second memory cell 306, suspension processing unit 728 may be configured to send a resumption command to page buffer circuit 602 of memory device 104 via device I/O interface 730, to cause the program operation to be resumed through page buffer circuit 602.

In some implementations, suspension processing unit 728 may include a programmable logic device (PLD) (e.g., a field-programmable logic array (FPGA)) that is configured to provide the functionality described herein. In some implementations, in response to the execution of instructions or other data stored in memory 722, processor 720 can be configured to implement the functionality of suspension processing unit 728.

FIG. 8 is a graphical representation illustrating exemplary suspended program information stored in a page buffer circuit (e.g., page buffer circuit 602) during an execution of a read operation, according to some aspects of the present disclosure. The suspended program information is associated with a program operation on a first memory cell 306, where the program operation is interrupted by the read operation performed on a second memory cell 306. Both first and second memory cells 306 are coupled to page buffer circuit 602 through the same bit line 316.

Table 2 of FIG. 8 illustrates suspended program information stored in page buffer circuit 602 during the execution of the read operation with respect to a TLC memory device, where page buffer circuit 602 has a 5-latch configuration. In Table 2, the program operation is configured to program a piece of 3-bits data at one of 8 levels to first memory cell 306, where the piece of 3-bits data includes 3 portions of page data (e.g., 3 bits from a current data page). By way of examples, inhibit information (INH) associated with the program operation is stored in sensing storage unit 612, and the 3 portions of page data (denoted as UP data, MP data, and LP data, respectively) are stored in BL storage unit 610, data storage unit ($D_2$) 606, and data storage unit ($D_1$) 606, respectively.

Table 3 of FIG. 8 illustrates suspended program information stored in page buffer circuit 602 during the execution of the read operation with respect to a QLC memory device, where page buffer circuit 602 has a 6-latch configuration. In Table 3, the program operation is configured to program a piece of 4-bits data at one of 16 levels to first memory cell 306, where the piece of 4-bits data includes 4 portions of page data (e.g., 4 bits from the current data page). By way of examples, inhibit information associated with the program operation is stored in sensing storage unit 612, and the 4 portions of page data (denoted as LP data, MP data, UP data, and XP data, respectively) are stored in data storage unit ($D_1$) 606, data storage unit ($D_2$) 606, data storage unit ($D_3$) 606, and BL storage unit 610, respectively.

It is noted from Tables 2 and 3 that only one storage unit (e.g., cache storage unit 608) is left in an idle state and can be used for the read operation during the suspension of the program operation. Consistent with certain aspects of the present disclosure, the read operation can be initiated during the suspension of the program operation through the usage of the SO node and cache storage unit 608 as disclosed herein.

FIG. 9 is a graphical representation illustrating an exemplary process for reading a portion of page data (e.g., LP data), according to some aspects of the present disclosure. FIG. 9 is described below with combined reference to FIG. 6C. In some implementations, a gray code may be used to program a piece of N-bits data at one of $2^N$ levels to a memory cell. For example, the piece of N-bits data in the form of a binary-coded value can be first translated/encoded using gray code translation/encoding to form a gray-coded programming value. The gray-coded programming value can then be programmed into and read from the memory cell.

For example, for a QLC NAND Flash memory device, an operation scheme (e.g., an 8-16 scheme or a 16-16 scheme) can be used for program and read operations. According to the 8-16 scheme, the memory cell is first programmed to one of 8 intermediate levels in a coarse programming pass (e.g., a non-last programming pass), and then programmed to one of 16 levels (16 threshold voltage levels corresponding to the 16 states of a QLC NAND Flash cell) in a fine programming pass (e.g., the last programming pass). According to the 16-16 scheme, the memory cell is first programmed to one of 16 levels of broader distributions in a coarse programming pass, and then reprogrammed to one of 16 voltage levels of narrower distributions in a fine programming pass. To read the programmed level of the memory cell under the 8-16 scheme or the 16-16 scheme, respective read voltages (e.g., respective sensing levels) are applied on the memory cell to read and determine the state of the memory cell.

Taking a QLC NAND Flash cell as an example, the following description for FIG. 9 is provided with respect to an application of the 16-16 scheme. It is understood that similar operations can be performed with respect to other schemes (such as the 8-16 scheme) and other types of memory cells. Table 4 of FIG. 9 illustrates a gray-code look-up table (LUT) used in the 16-16 scheme for the program and read operations of a QLC NAND Flash cell. Table 4 depicts a mapping relationship between the states of the QLC NAND Flash cell and the gray-coded programming values. With respect to a program operation using the 16-16 scheme, a corresponding gray-coded programming value (e.g., 4 bits of data) is used to perform both a coarse programming pass and a fine programming pass. With respect to a read operation, to read the state of the QLC NAND Flash cell using the 16-16 scheme, 3, 4, 4, and 4 read times may be needed to read LP data, MP data, UP data, and XP data of the gray-coded programming value stored in the QLC NAND Flash cell, respectively.

For example, a row 902 of Table 4 illustrates the bit value for the level of the erased state (level 0) and 15 levels of the programmed states (from level 1 to level 15), respectively, with respect to the LP data. In row 902 of Table 4, the bit value is changed 3 times, and thus, 3 read times are needed to read the LP data. That is, the bit value is changed from "1" to "0" when the programmed level is changed from level 1 to level 2, from "0" to "1" when the programmed level is changed from level 7 to level 8, and from "1" to "0" again when the programmed level is changed from level 13 to level 14. Thus, 3 sensing levels corresponding to the 3 read times can be determined based on the changes of the bit value. For example, the 3 sensing levels may include level 2, level 8, and level 14, respectively. The 3 sensing levels can be respectively applied to the memory cell to update a sensing result of the LP data in cache storage unit 608, as described below in more detail with reference to Table 5 of FIG. 9.

Similarly, 4 read times are needed to read the MP data, with 4 sensing levels to be level 3, level 7, level 9, and level 13, respectively. Also, 4 read times are needed to read the UP data, with 4 sensing levels to be level 5, level 10, level 12, and level 15, respectively. Besides, 4 read times are needed to read the XP data, with 4 sensing levels to be level 1, level 4, level 6, and level 11, respectively.

Table 5 of FIG. 9 shows the bit values stored (or latched) in the SO node and cache storage unit 608 during the read process of the LP data with respect to various voltage levels programmed in the memory cell. The various voltage levels may include level 0 corresponding to the erased state ("E"), level 1 corresponding to the $1^{st}$ programmed state ("P1"), . . . , and level 15 corresponding to the $15^{th}$ programmed state ("P15").

In some implementations, in order to read the LP data, control logic 512 may control the SO node and cache storage unit 608 to prepare for sensing the LP data. Specifically, control logic 512 may set cache storage unit 608 to initiate a sensing result stored in cache storage unit 608, so that the sensing result is initiated to have a bit value of "1". Control logic 512 may also control page buffer circuit 602 to pre-charge the SO node so that the SO node stores a bit value of "1". For example, as shown in a row 904 of Table 5, cache storage unit 608 is initiated to have a bit value of "1" (e.g., set C=1) regardless of which state (e.g., erased state or programmed state) the memory cell is in. As shown in a row 906 of Table 5, the SO node is pre-charged to have a bit value of "1" (e.g., configuring the Prech_all signal of FIG.

6C so that pre-charge circuit 664 of FIG. 6C can pre-charge the SO node), regardless of which state the memory cell is in.

In some implementations, control logic 512 may determine 3 read times for the LP data and 3 sensing levels for the 3 read times, respectively, based on row 902 of Table 4. The 3 sensing levels are level 2, level 8, and level 14, which are determined based on the changes in the bit value of the LP data in row 902 of Table 4. Control logic 512 may control the SO node and cache storage unit 608 to sense the LP data based on the 3 read times and the 3 sensing levels associated with the LP data.

Specifically, control logic 512 may control page buffer circuit 602 to apply the first sensing level (e.g., level 2) to the memory cell to update the sensing result in cache storage unit 608. For example, control logic 512 may control page buffer circuit 602 to apply the first sensing level (e.g., level 2) to the memory cell so that the SO node is discharged (e.g., sensing @L2). The bit value stored in the SO node is shown in a row 908 of Table 5 with respect to different states of the memory cell (e.g., states "E", "P1", . . . , "P15"), respectively. That is, if the memory cell is in the erased state or the P1 state, the bit value stored in the SO node is changed from "1" (as shown in row 906) to "0" (as shown in row 908); or, if the memory cell is in one of the P2-P15 states, the bit value stored in the SO node is still "1" (as shown in row 908). Also, control logic 512 may control page buffer circuit 602 to update the sensing result in cache storage unit 608 based on the bit value stored in the SO node (e.g., configuring the RST_C signal of FIG. 6C to reset cache storage unit 608 based on the bit value stored in the SO node). For example, as shown in a row 910 of Table 5, if the memory cell is in the erased state or the P1 state, the bit value stored in cache storage unit 608 is still "1"; or, if the memory cell is in one of the P2-P15 states, the bit value stored in cache storage unit 608 is changed from "1" (as shown in row 904) to "0" (as shown in row 910).

After the first sensing level (e.g., level 2) is applied to the memory cell, control logic 512 may control page buffer circuit 602 to pre-charge the SO node before applying the second sensing level (e.g., level 8) to the memory cell, as shown in a row 912 of Table 5. That is, the Prech_all signal of FIG. 6C is set so that pre-charge circuit 664 is configured to pre-charge the SO node again. Then, control logic 512 may control page buffer circuit 602 to apply the second sensing level (e.g., level 8) to the memory cell to update the sensing result in cache storage unit 608. For example, control logic 512 may control page buffer circuit 602 to apply the second sensing level (e.g., level 8) to the memory cell so that the SO node is discharged (e.g., sensing @L8). The bit value stored in the SO node is shown in a row 914 of Table 5 with respect to the different states of the memory cell (e.g., states "E," "P1," . . . , "P15"), respectively. Also, control logic 512 may control page buffer circuit 602 to update the sensing result in cache storage unit 608 based on the bit value stored in the SO node (e.g., configuring the SET_C signal of FIG. 6C to set cache storage unit 608 based on the bit value stored in the SO node), as shown in a row 916 of Table 5.

Further, after the second sensing level (e.g., level 8) is applied to the memory cell, control logic 512 may control page buffer circuit 602 to pre-charge the SO node before applying the third sensing level (e.g., level 14) to the memory cell, as shown in a row 918 of Table 5. That is, the Prech_all signal of FIG. 6C is set so that pre-charge circuit 664 is configured to pre-charge the SO node again. Then, control logic 512 may control page buffer circuit 602 to apply the third sensing level (e.g., level 14) to the memory cell to update the sensing result in cache storage unit 608. For example, control logic 512 may control page buffer circuit 602 to apply the third sensing level (e.g., level 14) to the memory cell so that the SO node is discharged (e.g., sensing @L14). The bit value stored in the SO node is shown in a row 920 of Table 5 with respect to the different states of the memory cell, respectively. Also, control logic 512 may control page buffer circuit 602 to update the sensing result in cache storage unit 608 based on the bit value stored in the SO node (e.g., configuring the RST_C signal of FIG. 6C to reset cache storage unit 608 based on the bit value stored in the SO node), as shown in a row 922 of Table 5.

After each of the 3 sensing levels (e.g., level 2, level 8, and level 14) is applied to the memory cell, respectively, control logic 512 may control page buffer circuit 602 to output the sensing result from cache storage unit 608 to interface 516 as the LP data. It is noted that, after the 3 sensing levels are applied, the sensing result stored in cache storage unit 608 with respect to the different states of the memory cell is identical to the bit value of the LP data with respect to the different voltage levels programmed into the memory cell. That is, the bit value of the LP data shown in row 902 of Table 4 is identical to the sensing result shown in row 922 of Table 5. For example, with respect to the programmed state P1, after the 3 sensing levels are applied, the sensing result in cache storage unit 608 is "1", which is identical to the bit value of "1" for the LP data with respect to level 1 in row 902 of Table 4. As a result, cache storage unit 608 can be used to read out the LP data correctly.

By performing operations like those described above, the MP data, the UP data, and the XP data may be read out one by one through the SO node and cache storage unit 608, respectively. Thus, the read operation on the memory cell is completed.

Figure 10:
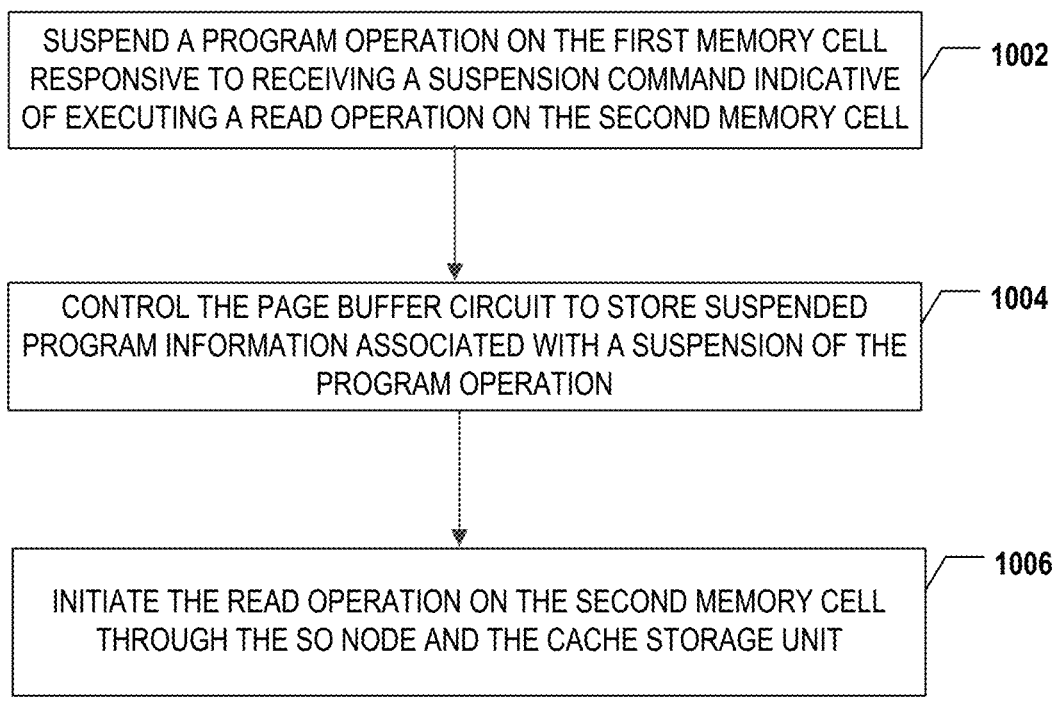
FIG. 10 illustrates a flowchart of an exemplary method for operating a memory device, according to some aspects of the present disclosure.

FIG. 10 illustrates a flowchart of an exemplary method 1000 for operating a memory device, according to some aspects of the present disclosure. The memory device may be any suitable memory device disclosed herein, such as memory device 300. Method 1000 may be implemented by peripheral circuits 302, such as control logic 512. It is understood that the operations shown in method 1000 may not be exhaustive and that other operations can be performed as well before, after, or between any of the illustrated operations. Further, some of the operations may be performed simultaneously, or in a different order than shown in FIG. 10.

In some implementations, the memory device may include an array of memory cells 306 including, e.g., a first memory cell 306 and a second memory cell 306. First and second memory cells 306 can be in a NAND memory string 308 coupled to a page buffer circuit (e.g., page buffer circuit 602) in page buffer/sense amplifier 504.

Referring to FIG. 10, method 1000 starts at operation 1002, in which a program operation on first memory cell 306 is suspended responsive to receiving a suspension command indicative of executing a read operation on second memory cell 306. For example, control logic 512 may suspend the program operation on first memory cell 306 if the program operation is interrupted by the read operation on second memory cell 306.

Method 1000 proceeds to operation 1004, as illustrated in FIG. 10, in which page buffer circuit 602 is controlled to store suspended program information associated with a suspension of the program operation. For example, the program operation is configured to write a piece of N-bits data at one of $2^N$ levels to first memory cell 306, where the piece of N-bits data includes N portions of page data. Then, the suspended program information includes, for example, the N portions of page data and inhibit information associated with the program operation. Control logic 512 may control page buffer circuit 602 to store the N portions of page data and the inhibit information in sensing storage unit 612, BL storage unit 610, and N−1 data storage units 606 of page buffer circuit 602, respectively. In this case, cache storage unit 608 of page buffer circuit 602 is in an idle state.

Method 1000 proceeds to operation 1006, as illustrated in FIG. 10, in which the read operation on second memory cell 306 is initiated through the SO node and cache storage unit 608. For example, the read operation is configured to read a piece of N-bits data at one of $2^N$ levels from second memory cell 306, where the piece of N-bits data includes N portions of page data. Initially, for each portion of page data from the N portions of page data stored in second memory cell 306, control logic 512 may control the SO node and cache storage unit 608 to prepare for sensing the portion of page data. Next, control logic 512 may control the SO node and cache storage unit 608 to sense the portion of page data based on a plurality of read times associated with the portion of page data. By sensing each of the N portions of page data stored in second memory cell 306 one by one through the SO node and cache storage unit 608, the read operation on second memory cell 306 can be achieved during the suspension of the program operation.

Figure 11:
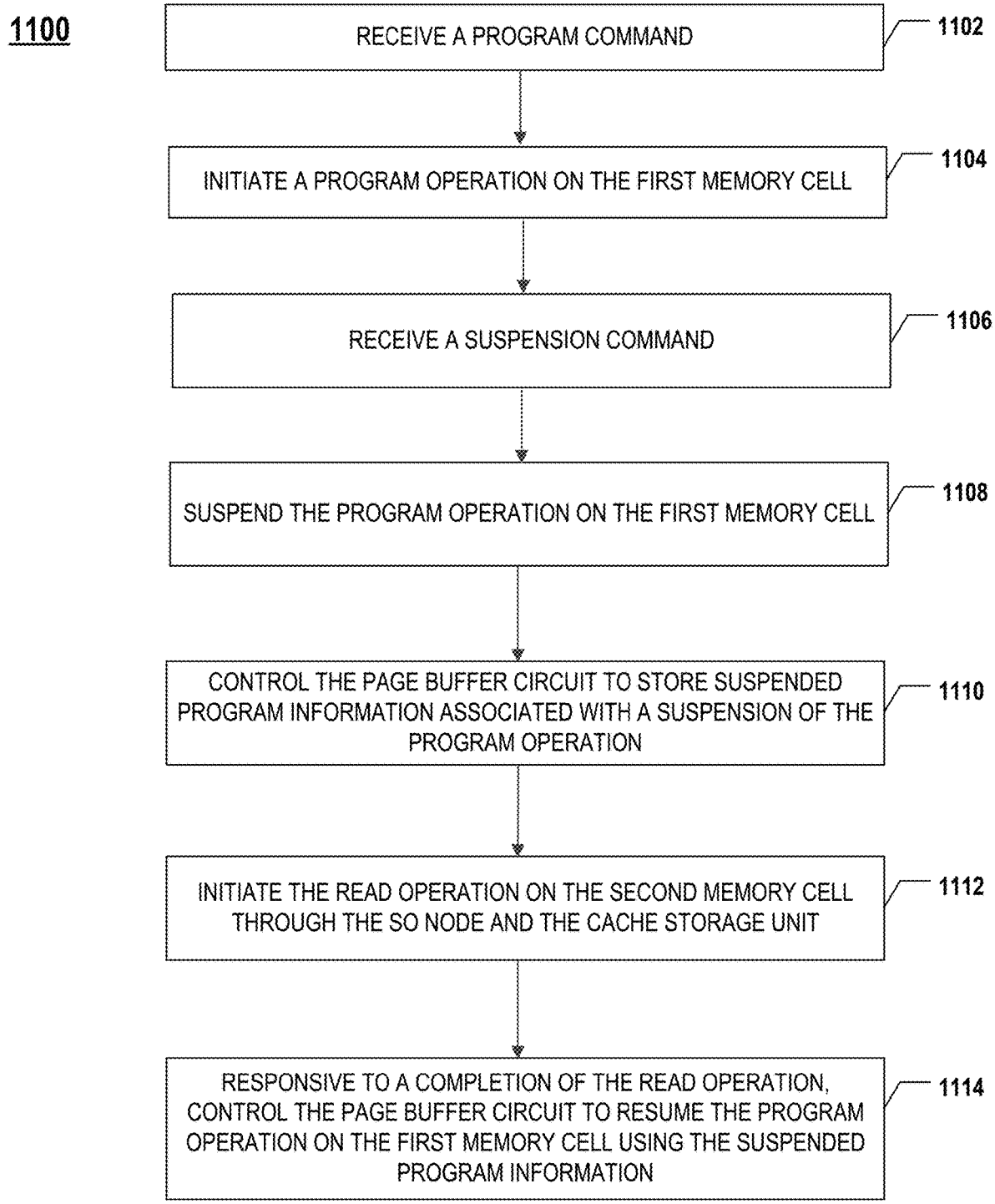
FIG. 11 illustrates a flowchart of another exemplary method for operating a memory device, according to some aspects of the present disclosure.

FIG. 11 illustrates a flowchart of another exemplary method 1100 for operating a memory device, according to some aspects of the present disclosure. The memory device may be any suitable memory device disclosed herein, such as memory device 300. Method 1100 may be implemented by peripheral circuits 302, such as control logic 512. It is understood that the operations shown in method 1100 may not be exhaustive and that other operations can be performed as well before, after, or between any of the illustrated operations. Further, some of the operations may be performed simultaneously, or in a different order than shown in FIG. 11.

In some implementations, the memory device may include an array of memory cells 306 including, e.g., a first memory cell 306 and a second memory cell 306. First and second memory cells 306 are from a NAND memory string 308 coupled to a page buffer circuit 602 in page buffer/sense amplifier 504.

Referring to FIG. 11, method 1100 starts at operation 1102, in which a program command is received. For example, control logic 512 may receive a program command indicative of executing a program operation on first memory cell 306.

Method 1100 proceeds to operation 1104, as illustrated in FIG. 11, in which the program operation is initiated on first memory cell 306. For example, control logic 512 can initiate the program operation on first memory cell 306.

In some implementations, control logic 512 receives the program command from memory controller 106 through interface 516, and in response, sends control signals to at least row decoder/word line driver 508, column decoder/bit line driver 506, and voltage generator 510 to initiate the program operation on first memory cell 306 coupled to select word line 318. Depending on the number of states to be programmed (i.e., the number of bits in each memory cell 306, e.g., SLC, MLC, TLC, QLC, etc.), one or more program passes can be performed. In each program pass, one or more program/verify cycles (e.g., N−1, N, N+1, N+2, . . . ) can be included in the program operation in sequence.

During the program operation, in any program/verify cycle, a program voltage (i.e., a voltage pulse signal including one or more program pulses, e.g., Vpgm_n−1, Vpgm_n, Vpgm_n+1, and Vpgm_n+2) is applied to select word line 318 by word line driver 508 to program first memory cell 306 coupled to select word line 318. For example, the 8-16 scheme or the 16-16 scheme described above can be used to perform the program operation on first memory cell 306.

Method 1100 proceeds to operation 1106, as illustrated in FIG. 11, in which a suspension command is received. For example, control logic 512 may receive the suspension command indicating that the program operation on first memory cell 306 is interrupted by a read operation on second memory cell 306.

Method 1100 proceeds to operation 1108, as illustrated in FIG. 11, in which the program operation on first memory cell 306 is suspended. For example, control logic 512 may suspend the program operation responsive to receiving the suspension command.

In some implementations, control logic 512 can be configured to receive a suspension command, for example, from memory controller 106 during the program operation. The suspension command is issued by memory controller 106 when an interrupt occurs, according to some implementations. The interrupt can be any request by a host (e.g., host 108 in FIG. 1) that needs to interrupt the ongoing program operation performed by memory device 300, so that the event can be processed in a timely manner. For example, a read operation may need to be performed on page 320 of memory cell array 301 immediately before the completion of the currently performed program operation. In some implementations, the interrupt occurs while applying a program pulse on select word line 318. It is also understood that the interrupt (and the receipt of the suspension command) may occur in any program/verify cycle (including the first cycle, the last cycle, or any intermediate cycles) or in a single program/verify cycle. It is further understood that the number of the interrupt events and the resulting suspension commands may vary during different program operations, for example, from 0 (i.e., a normal program operation) to the same number as the program pulses. In response to receiving a suspension command, peripheral circuits 302 can be configured to suspend the ongoing program operation.

Method 1100 proceeds to operation 1110, as illustrated in FIG. 11, in which the page buffer circuit 602 is controlled to store suspended program information associated with a suspension of the program operation. For example, control logic 512 is configured to store suspended program information associated with the suspension of the program operation in page buffer circuit 602.

Method 1100 proceeds to operation 1112, as illustrated in FIG. 11, in which the read operation is initiated on second memory cell 306 through an SO node and cache storage unit 608 of page buffer circuit 602. For example, control logic 512 can send control signals to page buffer circuit 602 and other peripheral circuits 302 (e.g., row decoder/word line driver 508, column decoder/bit line driver 506, voltage generator 510, etc.) to perform the read operation on second memory cell 306.

Method 1100 proceeds to operation 1114, as illustrated in FIG. 11, in which responsive to the completion of the read operation, page buffer circuit 602 is controlled to resume the program operation on first memory cell 306 using the suspended program information. For example, in response to the completion of the read operation, peripheral circuits 302 including control logic 512 can be configured to resume the suspended program operation. In some implementations, control logic 512 is configured to send control signals to page buffer circuit 602, row decoder/word line driver 508, column decoder/bit line driver 506, and/or voltage generator 510 to resume the suspended program operation based on the suspended program information.

With combined reference to FIGS. 6A-11 described above, during the suspension of the ongoing program operation, the solution disclosed herein may utilize a storage unit (e.g., the cache storage unit) as well as the SO node of the page buffer circuit to initiate the read operation. Since all the suspended program information associated with the program operation is stored in the page buffer circuit, the program operation can be resumed through the page buffer circuit after the read operation is completed. Thus, the program-operation suspension feature can be supported by the memory device under the non-destructive mode through the usage of the SO node and the cache storage unit for the read operation.

In the solution disclosed herein, since the sensing storage unit is not used in the read operation during the suspension of the program operation, a larger array common source (ACS) noise may be incurred when compared to that of a normal read operation which also uses the sensing storage unit for the read operation. Thus, a higher failed bit count (FBC) can be potentially introduced in the solution disclosed herein. For example, since the cache storage unit is not optimized for the read operation like the sensing storage unit, a higher FBC may be potentially introduced due to the usage of the cache storage unit in the read operation during the suspension of the program operation. To reduce the FBC in the solution disclosed herein, a size and/or other parameters of the cache storage unit can be adjusted to reduce the ACS noise. A discharging time of the SO node can also be prolonged to reduce the ACS noise. Thus, the FBC in the solution disclosed herein can be reduced through the adjustment of the size and/or other parameters of the cache storage unit and the prolonging of the discharging time of the SO node.

According to one aspect of the present disclosure, a memory device includes an array of memory cells and a peripheral circuit coupled to the array of memory cells. The array of memory cells includes a first memory cell and a second memory cell. The peripheral circuit includes a page buffer and control logic. The page buffer includes at least a page buffer circuit that is coupled to the first and second memory cells, respectively. The page buffer circuit includes an SO node and a cache storage unit. The control logic is coupled to the page buffer and configured to suspend a program operation on the first memory cell responsive to receiving a suspension command indicative of executing a read operation on the second memory cell. The control logic is further configured to control the page buffer circuit to store suspended program information associated with a suspension of the program operation and initiate the read operation on the second memory cell through the SO node and the cache storage unit.

In some implementations, the read operation is configured to read a first piece of N-bits data at a first one of $2^N$ levels from the second memory cell. The first piece of N-bits data includes N portions of first page data, and N is an integer greater than 1.

In some implementations, to initiate the read operation on the second memory cell through the SO node and the cache storage unit, the control logic is further configured to, for each portion of first page data stored in the second memory cell, control the SO node and the cache storage unit to prepare for sensing the portion of first page data, and control the SO node and the cache storage unit to sense the portion of first page data based on a plurality of read times associated with the portion of first page data.

In some implementations, to control the SO node and the cache storage unit to prepare for sensing the portion of first page data, the control logic is further configured to set the cache storage unit to initiate a sensing result stored in the cache storage unit and control the page buffer circuit to pre-charge the SO node.

In some implementations, to control the SO node and the cache storage unit to sense the portion of first page data based on the plurality of read times, the control logic is further configured to determine the plurality of read times for the portion of first page data, determine a plurality of sensing levels for the plurality of read times, respectively, and control the page buffer circuit to apply the plurality of sensing levels to the second memory cell, respectively, to update a sensing result in the cache storage unit.

In some implementations, the control logic is further configured to responsive to the plurality of sensing levels being applied to the second memory cell, respectively, control the page buffer circuit to output the sensing result stored in the cache storage unit as the portion of first page data.

In some implementations, to control the page buffer circuit to apply the plurality of sensing levels to the second memory cell, respectively, to update the sensing result in the cache storage unit, the control logic is further configured to, for each sensing level from the plurality of sensing levels, control the page buffer circuit to apply the sensing level to the second memory cell so that the SO node is discharged, and control the page buffer circuit to update the sensing result in the cache storage unit based on a data value stored in the SO node.

In some implementations, the control logic is further configured to after the sensing level is applied to the second memory cell, control the page buffer circuit to pre-charge the SO node before applying a next sensing level to the second memory cell.

In some implementations, the control logic is further configured to responsive to a completion of the read operation, control the page buffer circuit to resume the program operation on the first memory cell using the suspended program information.

In some implementations, the first and second memory cells are in a three-dimensional (3D) NAND memory string.

In some implementations, the program operation is configured to write a second piece of N-bits data at a second one of $2^N$ levels to the first memory cell. The second piece of N-bits data includes N portions of second page data, and N is an integer greater than 1. The page buffer circuit further includes a sensing storage unit, a bit line storage unit, and N−1 data storage units. The suspended program information includes the N portions of second page data and inhibit information associated with the program operation. To control the page buffer circuit to store the suspended program information, the control logic is configured to control the page buffer circuit to store the N portions of second page data and the inhibit information in the sensing storage unit, the bit line storage unit, and the N−1 data storage units, respectively.

According to another aspect of the present disclosure, a system includes a memory device configured to store data and a memory controller coupled to the memory device. The memory device includes an array of memory cells and a peripheral circuit coupled to the array of memory cells. The array of memory cells includes a first memory cell and a second memory cell. The peripheral circuit includes a page buffer and control logic coupled to the page buffer. The page buffer includes at least a page buffer circuit that is coupled to the first and second memory cells, respectively. The page buffer circuit includes an SO node and a cache storage unit. The control logic is coupled to the page buffer and configured to suspend a program operation on the first memory cell responsive to receiving a suspension command indicative of executing a read operation on the second memory cell. The cache storage unit is in an idle state responsive to a suspension of the program operation. The control logic is further configured to initiate the read operation on the second memory cell through the SO node and the cache storage unit. The memory controller is configured to control the memory device.

In some implementations, the read operation is configured to read a first piece of N-bits data at a first one of $2^N$ levels from the second memory cell. The first piece of N-bits data includes N portions of first page data, and N is an integer greater than 1.

In some implementations, to initiate the read operation on the second memory cell through the SO node and the cache storage unit, the control logic is further configured to, for each portion of first page data stored in the second memory cell, control the SO node and the cache storage unit to prepare for sensing the portion of first page data, and control the SO node and the cache storage unit to sense the portion of first page data based on a plurality of read times associated with the portion of first page data.

In some implementations, to control the SO node and the cache storage unit to prepare for sensing the portion of first page data, the control logic is further configured to set the cache storage unit to initiate a sensing result stored in the cache storage unit and control the page buffer circuit to pre-charge the SO node.

In some implementations, to control the SO node and the cache storage unit to sense the portion of first page data based on the plurality of read times, the control logic is further configured to determine the plurality of read times for the portion of first page data, determine a plurality of sensing levels for the plurality of read times, respectively, and control the page buffer circuit to apply the plurality of sensing levels to the second memory cell, respectively, to update a sensing result in the cache storage unit.

In some implementations, the control logic is further configured to responsive to the plurality of sensing levels being applied to the second memory cell, respectively, control the page buffer circuit to output the sensing result stored in the cache storage unit as the portion of first page data.

In some implementations, to control the page buffer circuit to apply the plurality of sensing levels to the second memory cell, respectively, to update the sensing result in the cache storage unit, the control logic is further configured to, for each sensing level from the plurality of sensing levels, control the page buffer circuit to apply the sensing level to the second memory cell so that the SO node is discharged, and control the page buffer circuit to update the sensing result in the cache storage unit based on a data value stored in the SO node.

In some implementations, the control logic is further configured to after the sensing level is applied to the second memory cell, control the page buffer circuit to pre-charge the SO node before applying a next sensing level to the second memory cell.

In some implementations, the control logic is further configured to responsive to a completion of the read operation, control the page buffer circuit to resume the program operation on the first memory cell using suspended program information associated with the suspension of the program operation.

In some implementations, the first and second memory cells are in a three-dimensional (3D) NAND memory string.

In some implementations, to suspend the program operation on the first memory cell, the control logic is further configured to control the page buffer circuit to store suspended program information associated with the suspension of the program operation in the page buffer circuit.

In some implementations, the program operation is configured to write a second piece of N-bits data at a second one of $2^N$ levels to the first memory cell. The second piece of N-bits data includes N portions of second page data, and N is an integer greater than 1. The page buffer circuit further includes a sensing storage unit, a bit line storage unit, and N−1 data storage units. The suspended program information includes the N portions of second page data and inhibit information associated with the program operation. To control the page buffer circuit to store the suspended program information, the control logic is configured to control the page buffer circuit to store the N portions of second page data and the inhibit information in the sensing storage unit, the bit line storage unit, and the N−1 data storage units, respectively.

According to still another aspect of the present disclosure, a method for operating a memory device including an array of memory cells is provided. The array of memory cells includes a first memory cell and a second memory cell that are coupled to a page buffer circuit in a page buffer. The page buffer circuit includes an SO node and a cache storage unit. A program operation on the first memory cell is suspended responsive to receiving a suspension command indicative of executing a read operation on the second memory cell. The page buffer circuit is controlled to store suspended program information associated with a suspension of the program operation. The read operation on the second memory cell is initiated through the SO node and the cache storage unit.

In some implementations, the read operation is configured to read a first piece of N-bits data at a first one of $2^N$ levels from the second memory cell. The first piece of N-bits data includes N portions of first page data, and N is an integer greater than 1.

In some implementations, initiating the read operation on the second memory cell through the SO node and the cache storage unit includes, for each portion of first page data stored in the second memory cell, controlling the SO node and the cache storage unit to prepare for sensing the portion of first page data, and controlling the SO node and the cache storage unit to sense the portion of first page data based on a plurality of read times associated with the portion of first page data.

In some implementations, controlling the SO node and the cache storage unit to prepare for sensing the portion of first page data includes setting the cache storage unit to initiate a sensing result stored in the cache storage unit, and controlling the page buffer circuit to pre-charge the SO node.

In some implementations, controlling the SO node and the cache storage unit to sense the portion of first page data based on the plurality of read times includes determining the plurality of read times for the portion of first page data, determining a plurality of sensing levels for the plurality of read times, respectively, and controlling the page buffer circuit to apply the plurality of sensing levels to the second memory cell, respectively, to update a sensing result in the cache storage unit.

In some implementations, responsive to the plurality of sensing levels being applied to the second memory cell, respectively, the page buffer circuit is controlled to output the sensing result stored in the cache storage unit as the portion of first page data.

In some implementations, controlling the page buffer circuit to apply the plurality of sensing levels to the second memory cell, respectively, to update the sensing result in the cache storage unit includes, for each sensing level from the plurality of sensing levels, controlling the page buffer circuit to apply the sensing level to the second memory cell so that the SO node is discharged, and controlling the page buffer circuit to update the sensing result in the cache storage unit based on a data value stored in the SO node.

In some implementations, after the sensing level is applied to the second memory cell, the page buffer circuit is controlled to pre-charge the SO node before applying a next sensing level to the second memory cell.

In some implementations, responsive to a completion of the read operation, the page buffer circuit is controlled to resume the program operation on the first memory cell using the suspended program information.

In some implementations, the first and second memory cells are in a three-dimensional (3D) NAND memory string.

In some implementations, the program operation is configured to write a second piece of N-bits data at a second one of $2^N$ levels to the first memory cell. The second piece of N-bits data includes N portions of second page data, and N is an integer greater than 1. The page buffer circuit further includes a sensing storage unit, a bit line storage unit, and N−1 data storage units. The suspended program information includes the N portions of second page data and inhibit information associated with the program operation. Controlling the page buffer circuit to store the suspended program information includes controlling the page buffer circuit to store the N portions of second page data and the inhibit information in the sensing storage unit, the bit line storage unit, and the N−1 data storage units, respectively.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
an array of memory cells comprising a first memory cell and a second memory cell; and
a peripheral circuit coupled to the array of memory cells and comprising:
a page buffer comprising at least a page buffer circuit that is coupled to the first and second memory cells, respectively, the page buffer circuit comprising a sense out (SO) node and a cache storage unit; and
control logic coupled to the page buffer and configured to:
suspend a program operation on the first memory cell responsive to receiving a suspension command indicative of executing a read operation on the second memory cell;
control the page buffer circuit to store suspended program information associated with a suspension of the program operation; and
initiate the read operation on the second memory cell through the SO node and the cache storage unit,
wherein the read operation is configured to read a first piece of N-bits data at a first one of $2^N$ levels from the second memory cell, the first piece of N-bits data comprises N portions of first page data, and N is an integer greater than 1.

2. The memory device of claim 1, wherein to initiate the read operation on the second memory cell through the SO node and the cache storage unit, the control logic is further configured to:
for each portion of the first page data stored in the second memory cell,
control the SO node and the cache storage unit to prepare for sensing the portion of the first page data; and
control the SO node and the cache storage unit to sense the portion of the first page data based on a plurality of read times associated with the portion of the first page data.

3. The memory device of claim 2, wherein to control the SO node and the cache storage unit to prepare for sensing the portion of the first page data, the control logic is further configured to:
set the cache storage unit to initiate a sensing result stored in the cache storage unit; and
control the page buffer circuit to pre-charge the SO node.

4. The memory device of claim 2, wherein to control the SO node and the cache storage unit to sense the portion of the first page data based on the plurality of read times, the control logic is further configured to:
determine the plurality of read times for the portion of the first page data;
determine a plurality of sensing levels for the plurality of read times, respectively; and
control the page buffer circuit to apply the plurality of sensing levels to the second memory cell, respectively, to update a sensing result in the cache storage unit.

5. The memory device of claim 4, wherein the control logic is further configured to:
responsive to the plurality of sensing levels being applied to the second memory cell, respectively, control the page buffer circuit to output the sensing result stored in the cache storage unit as the portion of the first page data.

6. The memory device of claim 4, wherein to control the page buffer circuit to apply the plurality of sensing levels to the second memory cell, respectively, to update the sensing result in the cache storage unit, the control logic is further configured to:
for each sensing level from the plurality of sensing levels,
control the page buffer circuit to apply the sensing level to the second memory cell so that the SO node is discharged; and
control the page buffer circuit to update the sensing result in the cache storage unit based on a data value stored in the SO node.

7. The memory device of claim 6, wherein the control logic is further configured to:
after the sensing level is applied to the second memory cell, control the page buffer circuit to pre-charge the SO node before applying a next sensing level to the second memory cell.

8. The memory device of claim 1, wherein the control logic is further configured to:

responsive to a completion of the read operation, control the page buffer circuit to resume the program operation on the first memory cell using the suspended program information.

9. The memory device of claim 1, wherein the first and second memory cells are in a three-dimensional (3D) NAND memory string.

10. The memory device of claim 1, wherein:
the program operation is configured to write a second piece of N-bits data at a second one of $2^N$ levels to the first memory cell, wherein the second piece of N-bits data comprises N portions of second page data, and N is an integer greater than 1;
the page buffer circuit further comprises a sensing storage unit, a bit line storage unit, and N−1 data storage units;
the suspended program information comprises the N portions of the second page data and inhibit information associated with the program operation; and
to control the page buffer circuit to store the suspended program information, the control logic is configured to:
control the page buffer circuit to store the N portions of the second page data and the inhibit information in the sensing storage unit, the bit line storage unit, and the N−1 data storage units, respectively.

11. A memory system, comprising:
a memory device configured to store data and comprising:
an array of memory cells comprising a first memory cell and a second memory cell; and
a peripheral circuit coupled to the array of memory cells and comprising:
a page buffer comprising at least a page buffer circuit that is coupled to the first and second memory cells, respectively, the page buffer circuit comprising a sense out (SO) node and a cache storage unit; and
control logic coupled to the page buffer and configured to:
suspend a program operation on the first memory cell responsive to receiving a suspension command indicative of executing a read operation on the second memory cell, wherein the cache storage unit is in an idle state responsive to a suspension of the program operation; and
initiate the read operation on the second memory cell through the SO node and the cache storage unit, wherein the read operation is configured to read a first piece of N-bits data at a first one of $2^N$ levels from the second memory cell, the first piece of N-bits data comprises N portions of first page data, and N is an integer greater than 1; and
a memory controller coupled to the memory device and configured to control the memory device.

12. The memory system of claim 11, wherein to initiate the read operation on the second memory cell through the SO node and the cache storage unit, the control logic is further configured to:
for each portion of the first page data stored in the second memory cell,
control the SO node and the cache storage unit to prepare for sensing the portion of the first page data; and
control the SO node and the cache storage unit to sense the portion of the first page data based on a plurality of read times associated with the portion of the first page data.

13. The memory system of claim 12, wherein to control the SO node and the cache storage unit to prepare for sensing the portion of the first page data, the control logic is further configured to:
set the cache storage unit to initiate a sensing result stored in the cache storage unit; and
control the page buffer circuit to pre-charge the SO node.

14. The memory system of claim 12, wherein to control the SO node and the cache storage unit to sense the portion of the first page data based on the plurality of read times, the control logic is further configured to:
determine the plurality of read times for the portion of the first page data;
determine a plurality of sensing levels for the plurality of read times, respectively; and
control the page buffer circuit to apply the plurality of sensing levels to the second memory cell, respectively, to update a sensing result in the cache storage unit.

15. The memory system of claim 14, wherein the control logic is further configured to:
responsive to the plurality of sensing levels being applied to the second memory cell, respectively, control the page buffer circuit to output the sensing result stored in the cache storage unit as the portion of the first page data.

16. The memory system of claim 14, wherein to control the page buffer circuit to apply the plurality of sensing levels to the second memory cell, respectively, to update the sensing result in the cache storage unit, the control logic is further configured to:
for each sensing level from the plurality of sensing levels,
control the page buffer circuit to apply the sensing level to the second memory cell so that the SO node is discharged; and
control the page buffer circuit to update the sensing result in the cache storage unit based on a data value stored in the SO node.

17. The memory system of claim 16, wherein the control logic is further configured to:
after the sensing level is applied to the second memory cell, control the page buffer circuit to pre-charge the SO node before applying a next sensing level to the second memory cell.

18. A method for operating a memory device comprising an array of memory cells, the array of memory cells comprising a first memory cell and a second memory cell that are coupled to a page buffer circuit in a page buffer, the page buffer circuit comprising a sense out (SO) node and a cache storage unit, the method comprising:
suspending a program operation on the first memory cell responsive to receiving a suspension command indicative of executing a read operation on the second memory cell;
controlling the page buffer circuit to store suspended program information associated with a suspension of the program operation; and
initiating the read operation on the second memory cell through the SO node and the cache storage unit,
wherein the read operation is configured to read a first piece of N-bits data at a first one of $2^N$ levels from the second memory cell, the first piece of N-bits data comprises N portions of first page data, and N is an integer greater than 1.

19. The method of claim 18, wherein initiating the read operation on the second memory cell through the SO node and the cache storage unit comprises:

for each portion of the first page data stored in the second memory cell,
    controlling the SO node and the cache storage unit to prepare for sensing the portion of the first page data; and
    controlling the SO node and the cache storage unit to sense the portion of the first page data based on a plurality of read times associated with the portion of the first page data.

20. The method of claim 19, wherein controlling the SO node and the cache storage unit to prepare for sensing the portion of the first page data comprises:
    setting the cache storage unit to initiate a sensing result stored in the cache storage unit; and
    controlling the page buffer circuit to pre-charge the SO node.

* * * * *